US012568592B2

(12) United States Patent
Kim et al.

(10) Patent No.: US 12,568,592 B2
(45) Date of Patent: Mar. 3, 2026

(54) CONDUCTIVE MEMBER HAVING ELASTICITY AND ELECTRONIC DEVICE INCLUDING THE SAME

(71) Applicant: SAMSUNG ELECTRONICS CO., LTD., Suwon-si (KR)

(72) Inventors: Yeonwoo Kim, Suwon-si (KR); Yongbeen Yun, Suwon-si (KR); Taekkyun Choi, Suwon-si (KR); Hyunsoo Kim, Suwon-si (KR); Chonghwa Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 133 days.

(21) Appl. No.: 18/648,061

(22) Filed: Apr. 26, 2024

(65) Prior Publication Data

US 2024/0365486 A1 Oct. 31, 2024

Related U.S. Application Data

(63) Continuation of application No. PCT/KR2024/005415, filed on Apr. 22, 2024.

(30) Foreign Application Priority Data

Apr. 27, 2023 (KR) ......................... 10-2023-0055676
Jun. 2, 2023 (KR) ......................... 10-2023-0071509

(51) Int. Cl.
 *H04M 1/02* (2006.01)
 *H05K 5/02* (2006.01)
(52) U.S. Cl.
 CPC ......... *H05K 5/0217* (2013.01); *H05K 5/0247* (2013.01)

(58) Field of Classification Search
 None
 See application file for complete search history.

(56) References Cited

U.S. PATENT DOCUMENTS 7,880,095 B2 2/2011 Kang et al.
7,944,682 B2 5/2011 Park et al.
 (Continued)

FOREIGN PATENT DOCUMENTS

JP      2014-178710 A    9/2014
KR   10-2007-0047962 A    5/2007
 (Continued)

OTHER PUBLICATIONS

International Search Report (PCT/ISA/210) dated Aug. 5, 2024, issued by International Searching Authority in International Application No. PCT/KR2024/005415.

*Primary Examiner* — Xanthia C Relford
(74) *Attorney, Agent, or Firm* — Sughrue Mion, PLLC

(57) ABSTRACT

An electronic device includes a display including a panel conductive layer, a mechanical support part facing the display, and a conductive member disposed between the panel conductive layer and the mechanical support part where the conductive member includes an elastic member at least partially accommodated in the mechanical support part and a conductive plate electrically connected with the panel conductive layer, the conductive plate including a base region surrounding at least a portion of the elastic member and a wing region, the elastic member includes a front surface facing in a first direction toward the panel conductive layer and disposed in a higher position than the wing region, a side surface facing in a second direction perpendicular to the first direction, and a rear surface facing in a direction opposite to the first direction and disposed in a lower position than the wing region extending in the second direction.

20 Claims, 28 Drawing Sheets

(56)　　　　　References Cited

U.S. PATENT DOCUMENTS

| | | | |
|---|---|---|---|
| 9,538,681 | B2 | 1/2017 | Kim et al. |
| 9,578,758 | B2 | 2/2017 | Mo et al. |
| 9,986,072 | B2 * | 5/2018 | Lee ...................... H05K 9/0032 |
| 10,051,766 | B2 | 8/2018 | Ham et al. |
| 10,175,513 | B2 * | 1/2019 | Kubota ............... G02F 1/13318 |
| 10,198,131 | B2 * | 2/2019 | Yang ...................... G06V 40/13 |
| 10,534,405 | B2 | 1/2020 | Kim et al. |
| 11,029,788 | B2 | 6/2021 | Park et al. |
| 11,431,830 | B2 * | 8/2022 | Park .......................... H05K 1/02 |
| 11,432,410 | B2 * | 8/2022 | Woo ...................... G06F 3/0421 |
| 2009/0291608 | A1 | 11/2009 | Choi et al. |
| 2014/0268623 | A1 | 9/2014 | Kim et al. |
| 2015/0362801 | A1 | 12/2015 | Ichiza et al. |
| 2018/0299929 | A1 | 10/2018 | Kim et al. |
| 2020/0033970 | A1 | 1/2020 | Park et al. |

FOREIGN PATENT DOCUMENTS

| | | | |
|---|---|---|---|
| KR | 10-2008-0004026 | A | 1/2008 |
| KR | 10-2008-0030851 | A | 4/2008 |
| KR | 10-2009-0074423 | A | 7/2009 |
| KR | 10-2014-0039775 | A | 4/2014 |
| KR | 10-2014-0114096 | A | 9/2014 |
| KR | 10-1591658 | B1 | 2/2016 |
| KR | 10-2017-0014952 | A | 2/2017 |
| KR | 10-2018-0115153 | A | 10/2018 |
| KR | 10-2019-0102867 | A | 9/2019 |
| KR | 10-2020-0013194 | A | 2/2020 |
| KR | 10-2258846 | B1 | 6/2021 |
| KR | 10-2022-0125440 | A | 9/2022 |

* cited by examiner

<2101>

<2102>

410
420
430
450

+Z
+Y    +X

CONDUCTIVE MEMBER HAVING ELASTICITY AND ELECTRONIC DEVICE INCLUDING THE SAME

CROSS-REFERENCE TO RELATED APPLICATIONS

This application is a bypass continuation application, claiming priority under § 365(c), of an International application No. PCT/KR2024/005415, filed on Apr. 22, 2024, which is based on and claims the benefit of a Korean patent application number 10-2023-0055676, filed on Apr. 27, 2023 and a Korean patent application number 10-2023-0071509, filed on Jun. 2, 2023, in the Korean Intellectual Property Office, the disclosure of which is incorporated by reference herein in its entirety.

BACKGROUND

1. Field

Embodiments of the disclosure described herein relate to a conductive member having elasticity and an electronic device including the same.

2. Description of Related Art

Recently, electronic devices such as smartphones, tablet PCs, desktop PCs, portable multimedia players (PMPs), MP3 players, or wearable devices have been widely used, and users are able to access various contents through the electronic devices.

As the contents provided by the electronic devices are diversified, the electronic devices are implemented in the form of multimedia devices having complex functions.

As multimedia functions of an electronic device are diversified, various electronic components may be accommodated in the electronic device. For example, a display, an antenna, a printed circuit board, and a mechanical support part may be accommodated in the electronic device. When a resistance component of a conductive subsidiary member electrically connected with the display is increased, various integrated circuit chips or electrical/electronic components in the electronic device may malfunction to adversely affect the performance of the electronic device.

Embodiments of the disclosure provide an electronic device for stably maintaining performance.

SUMMARY

An electronic device according an embodiment of the disclosure includes a display including a panel conductive layer, a mechanical support part that faces the display, and a conductive member disposed between the panel conductive layer and the mechanical support part. The conductive member includes an elastic member at least partially accommodated in the mechanical support part and a conductive plate electrically connected with the panel conductive layer, the conductive plate including a base region that surrounds at least a portion of the elastic member and a wing region. The elastic member includes a front surface that faces in a first direction toward the panel conductive layer and that is disposed in a higher position than the wing region, a side surface that is parallel to the first direction and that faces in a second direction perpendicular to the first direction, and a rear surface that faces in a direction opposite to the first direction and that is disposed in a lower position than the wing region. The wing region extends in the second direction.

A conductive member according to an embodiment of the disclosure includes an elastic member and a conductive plate including a base region that surrounds at least a portion of the elastic member and a wing region. The elastic member includes a front surface that faces in a first direction and that is disposed in a higher position than the wing region, a side surface that is parallel to the first direction and that faces in a second direction perpendicular to the first direction, and a rear surface that faces in a direction opposite to the first direction and that is disposed in a lower position than the wing region.

BRIEF DESCRIPTION OF THE DRAWINGS

In the following description made with respect to the accompanying drawings, identical or similar components will be assigned with identical or similar reference numerals.

DETAILED DESCRIPTION

Hereinafter, various embodiments of the disclosure will be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
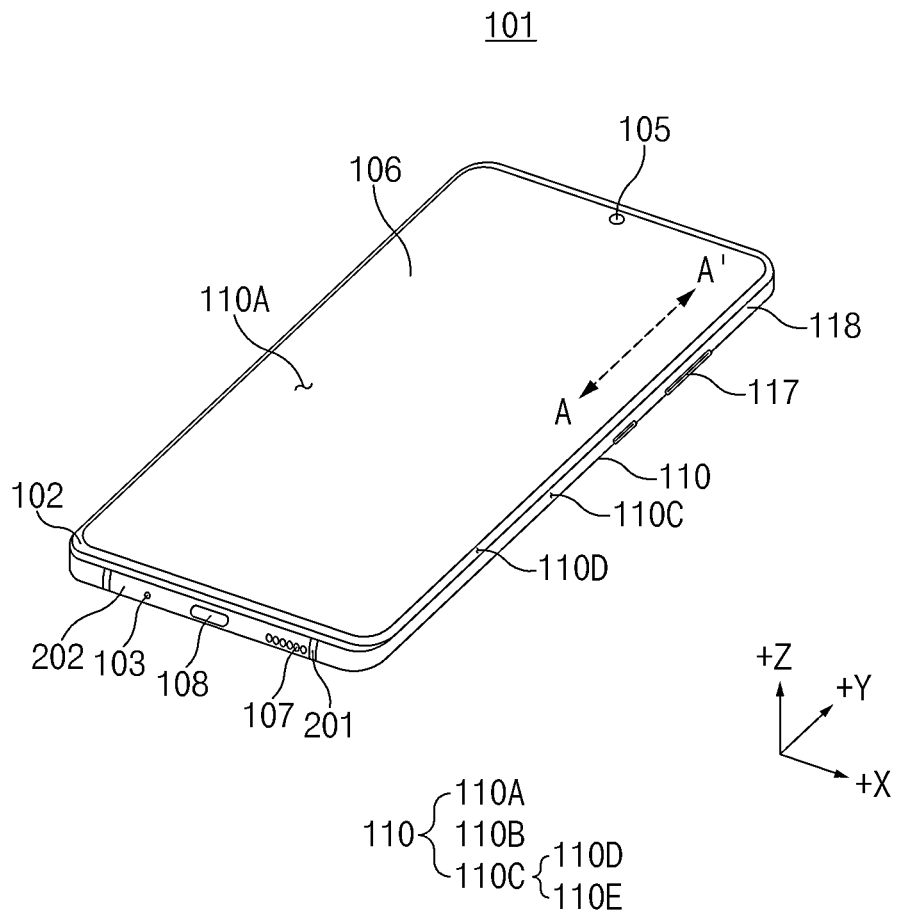
FIG. 1 is a perspective view illustrating a front side of an electronic device according to an embodiment.
Figure 2:
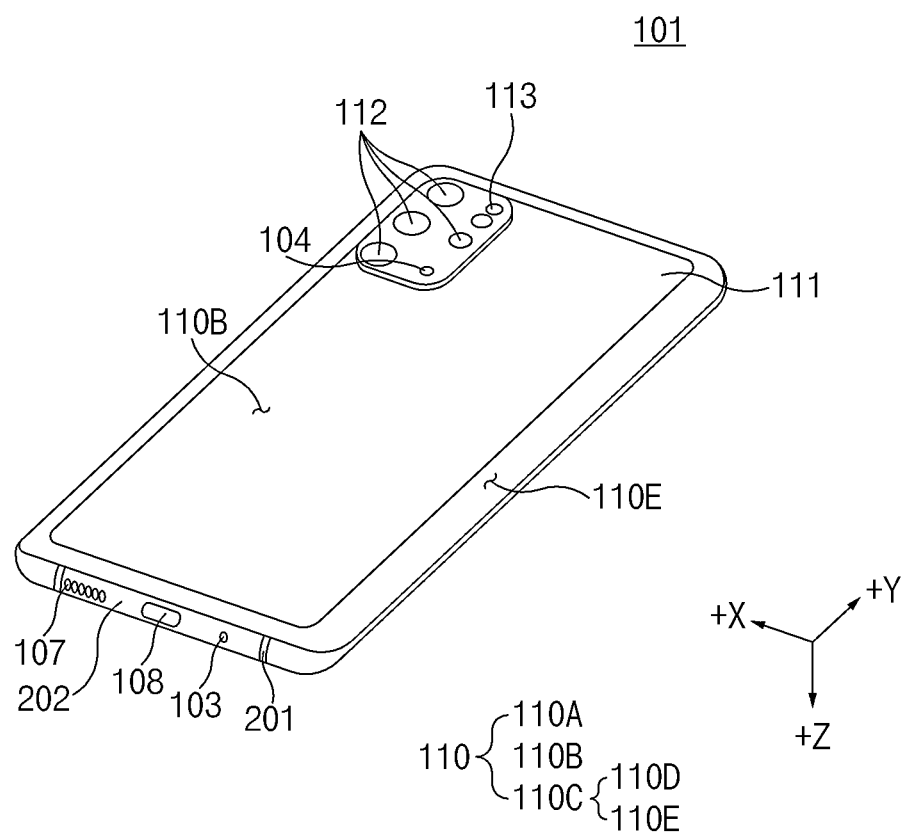
FIG. 2 is a perspective view illustrating a rear side of the electronic device according to an embodiment.

FIG. 1 illustrates a front view of an electronic device according to an embodiment, and FIG. 2 illustrates a rear view of an electronic device according to an embodiment.

Referring to FIGS. 1 and 2, an electronic device 101 may include a housing 110 including a first surface (or a front surface) 110A, a second surface (or a rear surface) 110B, and side surfaces 110C that surround a space between the first surface 110A and the second surface 110B.

In an embodiment (not illustrated), the housing 110 may refer to a structure that defines some of the first surface 110A, the second surface 110B, and the side surfaces 110C.

In an embodiment, the first surface 110A may be defined by a front plate 102 (e.g., a glass plate including various layers or a polymer plate), at least a portion of which is substantially transparent. The second surface 110B may be defined by a substantially opaque rear plate 111. The rear plate 111, for example, may be formed by coated or colored glass, ceramic, a polymer, a metal (e.g., aluminum, stainless steel (STS), or magnesium), or a combination of at least two of the materials. The side surfaces 110C may be coupled to the front plate 102 and the rear plate 111, and may be defined by side bezel structure (or "a frame structure or a side member") 118 including a metal and/or a polymer.

In an embodiment, the rear plate 111 and the side bezel structure 118 may be integrally formed, and may include the same material (e.g., a metallic material such as aluminum).

In the illustrated embodiment, the front plate 102 may include two first areas 110D that are deflected from a partial area of the first surface 110A toward the rear plate 111 and extend seamlessly. The first areas 110D may be located at opposite ends of a long edge of the front plate 102.

In the illustrated embodiment, the rear plate 111 may include two second areas 110E that are deflected from a partial area of the second surface 110B toward the front plate 102 and extend seamlessly. The second areas 110E may be located at opposite ends of a long edge of the rear plate 111.

In an embodiment, the front plate 102 (or the rear plate 111) may include only one of the first areas 110D (or the second areas 110E). Furthermore, in an embodiment, the front plate 102 (or the rear plate 111) may not include some of the first areas 110D (or the second areas 110E).

In an embodiment, when viewed from a lateral side of the electronic device 101, the side bezel structure 118 may have a first thickness (or a width) in a side direction (e.g., a short side), in which neither the first area 110D nor the second area 110E is included, and may have a second thickness that is smaller than the first thickness in a side direction (e.g., a long side), in which the first areas 110D or the second areas 110E are included.

In an embodiment, the electronic device 101 may include at least one of a display 106, audio modules 103 and 107, a sensor module (not illustrated), camera modules 105, 112, and 113, a key input device 117 (e.g., an input module), a light emitting element (not illustrated), and a connector hole 108. In an embodiment, the electronic device 101 may exclude at least one (e.g., the key input device 117 or the light emitting element (not illustrated)) of the components, or may further include another component.

In an embodiment, the display 106 may be visible through a corresponding portion of the front plate 102. For example, at least a portion of the display 106 may be visible through the front plate 102 including the first surface 110A, and the first areas 110D of the side surfaces 110C.

In an embodiment, a corner of the display 106 may have a shape that is substantially the same as an adjacent outer shape of the front plate 102. In an embodiment (not illustrated), to expand the visible area of the display 106, an interval between an outskirt of the display 106 and an outskirt of the front plate 102 may be formed to be substantially the same.

In an embodiment, a surface (or the front plate 102) of the housing 110 may include a screen display area that is formed as the display 106 is visible. For example, the screen display area may include the first surface 110A and the first areas 110D of the side surface.

In an embodiment (not illustrated), the screen display areas 110A and 110D may include a sensor area (not illustrated) that is configured to acquire biometric information of a user. Here, "the screen display areas 110A and 110D include the sensing area" may be understood that at least a portion of the sensing area may overlap the screen display areas 110A and 110D. For example, the sensor area (not illustrated) may refer, for example, to an area that may display visual information through the display 106 like the other areas of the screen display areas 110A and 110D and may additionally acquire biometric information (e.g., a fingerprint) of the user.

In an embodiment, the screen display areas 110A and 110D of the display 106 may include an area, through which the first camera module 105 (e.g., a punch hole camera) may be visually exposed. For example, at least a portion of a periphery of an area, in which the first camera module 105 is exposed, may be surrounded by the screen display areas 110A and 110D. In an embodiment, the first camera module 105 may include a plurality of camera modules.

In an embodiment (not illustrated), the display 106 may be coupled to or disposed to be adjacent to a touch detecting circuit, a pressure sensor that may measure an intensity (pressure) of a touch, and/or a digitizer that detects a stylus pen in a magnetic field scheme.

In an embodiment, the audio modules 103, 104, and 107 may include the microphone holes 103 and 104, and the speaker hole 107.

In an embodiment, the microphone holes 103 and 104 may include the first microphone hole 103 that is formed in a partial area of the side surface 110C and the second microphone hole 104 that is formed in a partial area of the second surface 110B. Microphones for acquiring external sound may be disposed in interiors of the microphone holes 103 and 104. The microphones may include a plurality of microphones to detect a direction of sound. In an embodiment, the second microphone hole 104 formed in a partial area of the second surface 110B may be disposed to be adjacent to the camera modules 105, 112, and 113. For example, the second microphone hole 104 may acquire sound when the camera modules 105, 112, and 113 are executed, or may acquire sound when another function is executed.

In an embodiment, the speaker hole 107 may include the external speaker hole 107 and a communication receiver hole (not illustrated). The external speaker hole 107 may be formed at a portion of the side surface 110C of the electronic device 101. In an embodiment, the external speaker hole 107 may be implemented by the microphone hole 103 in one hole. Although not illustrated, the communication receive hole (not illustrated) may be formed at another portion of the side surface 110C. For example, the communication receiver hole (not illustrated) may be formed at another portion (e.g., a portion that faces the +Y axis direction) of the side surface 110C, which faces a portion (e.g., a portion that faces the −Y axis direction) of the side surface 110C, at which the external speaker hole 107 is formed.

In an embodiment, the electronic device 101 may include a speaker that is communicated with the speaker hole 107. In an embodiment, the speaker may include a piezo speaker, in which the speaker hole 107 is omitted.

In an embodiment, the sensor module (not illustrated) may generate electrical signals or data values corresponding to an operation state of the interior of the electronic device 101 or an external environmental state. For example, the sensor module may include at least one of a proximity sensor, an HRM sensor, a fingerprint sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor.

In an embodiment, the camera modules 105, 112, and 113 may include the first camera module 105 (e.g., the punch hole camera) that is exposed through the first surface 110A of the electronic device 101, the second camera module 112 that is exposed through the second surface 110B, and/or the flash 113.

In an embodiment, the first camera module 105 may be exposed through a portion of the screen display areas 110A and 110D of the display 106. For example, the first camera module 105 may be exposed through a partial area of the screen display areas 110A and 110D through an opening (not illustrated) formed at a portion of the display 106.

In an embodiment, the second camera module 112 may include a plurality of camera modules (e.g., a dual camera, a triple camera, or a quad camera). However, the second camera module 112 is not necessary limited to including the plurality of camera modules, and may include one camera module.

The first camera module 105 and the second camera module 112 may include one or a plurality of lenses, an image sensor, and/or an image signal processor. The flash 113, for example, may include a light emitting diode or a xenon lamp. In an embodiment, two or more lenses (an infrared ray camera lens, a wide angle lens, and a telescopic lens), and image sensors may be disposed on one surface of the electronic device 101.

In an embodiment, the key input device 117 may be disposed on the side surfaces 110C (e.g., the first areas 110D and/or the second areas 110E) of the housing 110. In an embodiment, the electronic device 101 may not include some or all of the key input devices 117, and the key input device 117 that is not included may be implemented in another form, such as a soft key. In an embodiment, the key input device may include a sensor module (not illustrated) that defines a sensing area (not illustrated) included in the screen display areas 110A and 110D.

In an embodiment, the connector hole 108 may accommodate a connector. The connector hole 108 may be disposed on the side surface 110C of the housing 110. For example, the connector hole 108 may be disposed on the side surface 110C to be adjacent to at least some of the audio modules (e.g., the microphone hole 103 and the speaker hole

107). In an embodiment, the electronic device 101 may include the first connector hole 108 that may accommodate a connector (e.g., a USB connector) for transmitting and receiving electric power and/or data to and from an external device, and/or a second connector hole (not illustrated) that may accommodate a connector (e.g., an earphone jack) for transmitting and receiving an audio signal to and from an external device.

In an embodiment, the electronic device 101 may include a light emitting element (not illustrated). For example, the light emitting element (not illustrated) may be disposed on the first surface 110A of the housing 110. The light emitting element (not illustrated) may provide state information of the electronic device 101 in a form of light. In an embodiment, the light emitting element (not illustrated) may provide a light source that interworks with an operation of the first camera module 105. For example, the light emitting element (not illustrated) may include an LED, an IR LED, and/or a xenon lamp.

In an embodiment, at least a portion of the side bezel structure 118 may serve as an antenna electrically connected with a communication module. According to an embodiment, the side bezel structure 118 may include a conductive portion 202 formed of a metallic material and a cut-off portion 201 formed of a non-metallic material (e.g., a polymer). According to an embodiment, at least part of the conductive portion 202 may be a radiator (e.g., an antenna) that is electrically connected with the communication module and that radiates an RF signal output from the communication module.

Figure 3:
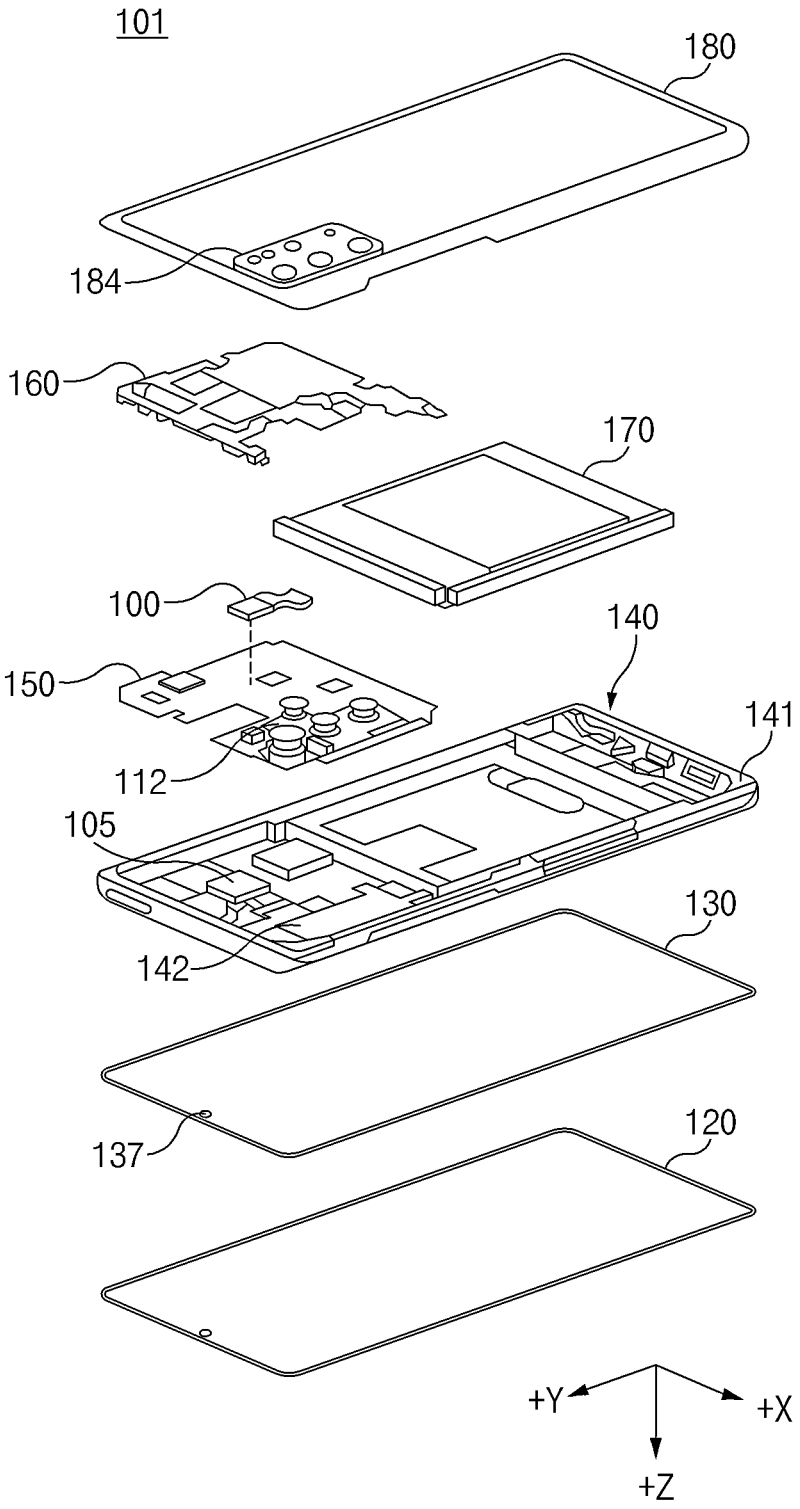
FIG. 3 is an exploded perspective view illustrating the electronic device according to an embodiment.

FIG. 3 is an exploded perspective view of the electronic device according to various embodiments.

Referring to FIG. 3, the electronic device 101 may include a front plate 120 (e.g., the front plate 102 of FIG. 1), a display 130 (e.g., the display 106 of FIG. 1), a bracket 140, a battery 170, a PCB 150, an RFPCB 100, a support member 160 (e.g., a rear case), and a rear plate 180 (e.g., the rear plate 111 of FIG. 2).

In an embodiment, the electronic device 101 may exclude at least one (e.g., the support member 160) from the components or may additionally include another component. At least one of the components of the electronic device 101 may be the same as or similar to at least one of the components of the electronic device 101 of FIGS. 1 and 2, and a repeated description thereof will be omitted hereinafter.

In an embodiment, at least some of the front plate 120, the rear plate 180, and the bracket 140 (e.g., a frame structure 141) may define the housing (e.g., the housing 110 of FIGS. 1 and 2).

In an embodiment, the bracket 140 may include the frame structure (or "the side member") 141 that defines a surface (e.g., a portion of the side surface 110C of FIG. 1) of the electronic device 101, and a plate structure 142 that extends from the frame structure 141 to an inside of the electronic device 101.

The plate structure 142 may be located in the interior of the electronic device 101, may be connected to the frame structure 141, or may be integrally formed with the frame structure 141. The plate structure 142, for example, may be formed of a metallic material and/or a nonmetallic material (e.g., a polymer). The display 130 may be coupled to one surface of the plate structure 142, and the PCB 150 may be coupled to a rear surface of the plate structure 142. A processor, a memory, and/or an interface may be mounted on the PCB 150. The processor, for example, may include one or more of a central processing device, an application processor, a graphic processing device, an image single processor, a sensor hub processor, or a communication processor.

The memory, for example, may include a volatile memory or a nonvolatile memory.

The interface, for example, may include a high definition multimedia interface (HDMI), a universal serial bus (USB), an interface, an SD card interface, and/or an audio interface. The interface, for example may electrically or physically connect the electronic device 101 to an external device, and may include a USB connector, an SD card/MMC connector, or an audio connector.

In an embodiment, the battery 170 may supply electric power to at least one of the components of the electronic device 101. For example, the battery 170 may include a primary battery that cannot be recharged, a secondary battery that may be recharged, or a fuel cell. In an embodiment, at least a portion of the battery 170 may be disposed on substantially the same plane as the PCB 150. In an embodiment, the battery 170 may be integrally disposed in the interior of the electronic device 101 or may be disposed to be attached to or detached from the electronic device 101.

In an embodiment, the first camera module 105 may be disposed in the plate structure 142 of the bracket 140 such that the lens is exposed through a partial area of the front plate 120 (e.g., the front surface 110A of FIG. 1) of the electronic device 101.

In an embodiment, the first camera module 105 may be disposed such that an optical axis of the lens is at least partially aligned with a hole or a recess 137 formed in the display 130. For example, the area, through which the lens is exposed, may be formed in the front plate 120. For example, the first camera module 105 may include a punch hole camera, at least a portion of which is disposed in an interior of the hole or the recess 137 formed on a rear surface of the display 130.

In an embodiment, the second camera module 112 may be disposed in the PCB 150 such that the lens is exposed through a camera area 184 of the rear plate 180 (e.g., the rear surface 110B of FIG. 2).

In an embodiment, the camera area 184 may be formed on a surface (e.g., the rear surface 110B of FIG. 2) of the rear plate 180. In an embodiment, the camera area 184 may be formed to be at least partially transparent such that external light is input to the lens of the second camera module 112. In an embodiment, at least a portion of the camera area 184 may protrude from the surface of the rear plate 180 by a specific height. However, the disclosure is not necessarily limited thereto, and the camera area 184 may define substantially the same plane as the surface of the rear plate 180.

The electronic device 101 according to various embodiments may include an electronic device such as a bar-type electronic device, a foldable electronic device, a rollable electronic device, a slidable electronic device, a wearable electronic device, a tablet PC, and/or a notebook PC. The electronic device 101 according to various embodiments of the disclosure may include various other electronic devices without being limited to the aforementioned examples.

Figure 4A:
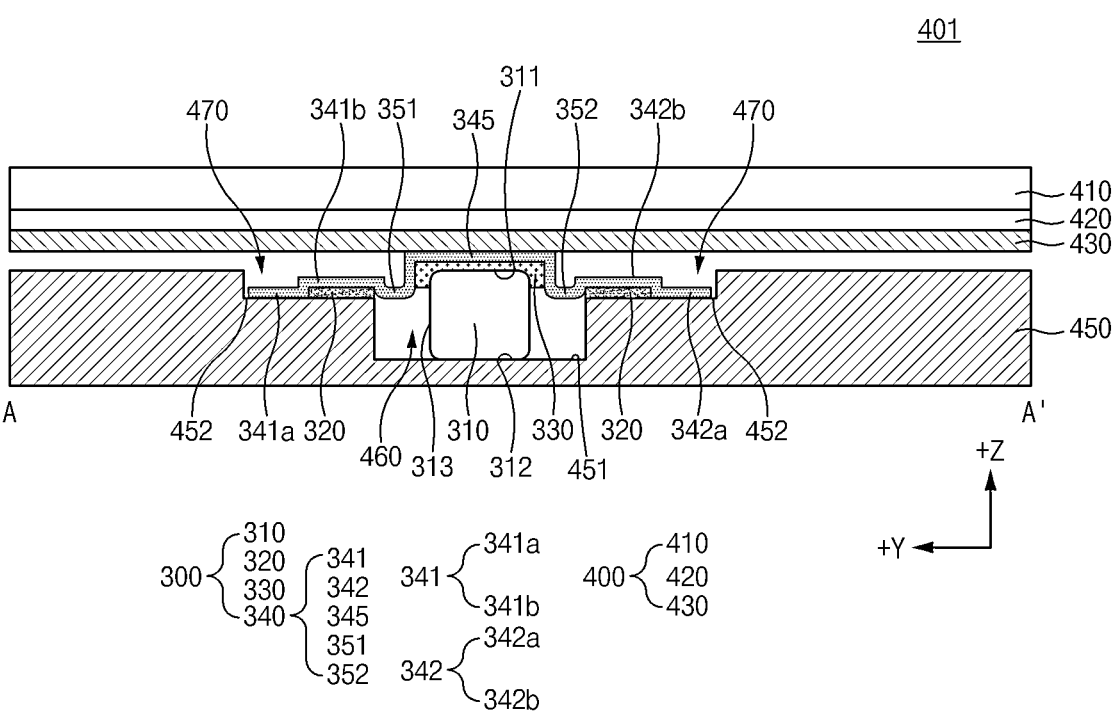
FIGS. 4A and 4B are sectional views illustrating a portion of an electronic device according to an embodiment.
Figure 4B:
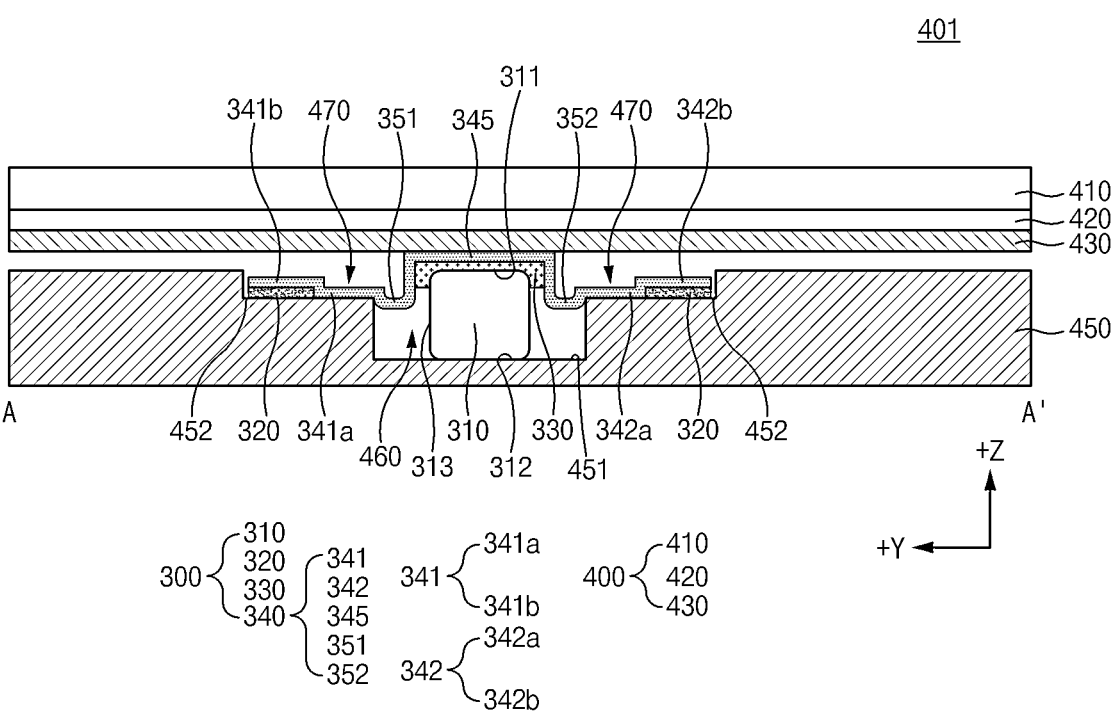

FIGS. 4A and 4B are sectional views illustrating a portion of an electronic device 401 according to an embodiment. The electronic device 401 illustrated in FIGS. 4A and 4B may be at least partially similar to the electronic device 101 illustrated in FIG. 1, or may further include other embodiments.

Referring to FIGS. 4A and 4B, the electronic device 401 according to an embodiment may include a display 400 (e.g., the display 106 of FIGS. 1 and 2 or the display 130 of FIG.

3), a mechanical support part 450 (e.g., the metal bracket 140 of FIG. 3), and a conductive plate 340. The electronic device 401 may include other embodiments in which at least some of the components are omitted or other components are added.

The display 400 may include various layers. For example, the display 400 may include a window layer 410, a display panel layer 420, and a panel conductive layer 430.

The window layer 410 may have a certain amount of transparency and may transmit light from the display panel layer 420 to the outside. The window layer 410 may include at least one of a polymer layer or a glass layer. For example, the window layer 410 may include a polymer layer and a glass layer disposed between the polymer layer and the display panel layer 420.

The display panel layer 420 may be disposed under the window layer 410. The display panel layer 420 may be disposed between the window layer 410 and the panel conductive layer 430. The display panel layer 420 may include a plurality of pixels and may display a screen through the plurality of pixels.

The panel conductive layer 430 may be disposed under the display panel layer 420. The panel conductive layer 430 may be disposed at the outermost periphery of the display 400. The panel conductive layer 430 may be a metal plate. The panel conductive layer 430 may help to reinforce the electronic device 401 and may be used to shield ambient noise and distribute heat released from a surrounding heat radiating part. According to an embodiment, the panel conductive layer 430 may include Cu, Al, SUS, or CLAD (e.g., a laminated member in which SUS and Al are alternately arranged).

According to an embodiment, at least one of a polymer member, a functional member, or a conductive member may be formed between the display panel layer 420 and the panel conductive layer 430. The polymer member may include an embo layer for removing bubbles that are likely to be generated between the display panel layer 420 and parts attached to the bottom thereof and a cushion layer for absorbing shock. The functional member may include a graphite sheet for heat dissipation, a force Touch FPCB, a fingerprint sensor FPCB, an antenna radiator for communication, a heat dissipation sheet, a conductive/non-conductive tape, or a sponge.

The panel conductive layer 430 may be electrically connected with at least one conductive member 300. The at least one conductive member 300 may be seated on the mechanical support part 450. The panel conductive layer 430 may be electrically connected with the mechanical support part 450 through the conductive member 300. In an embodiment, the mechanical support part 450 may be described as a support structure or a support member.

The mechanical support part 450 may be a metallic mechanical part located under the display 400. The mechanical support part 450 may include at least one opening region. For example, the mechanical support part 450 may include a first opening region 460 and at least one second opening region 470.

The first opening region 460 may be formed in a shape that is open toward the display 400. The first opening region 460 may be formed in the shape of a groove recessed in a direction opposite to a first direction (e.g., the +Z-axis direction) toward the display 400. At least a portion of an elastic member 310 of the conductive member 300 may be accommodated in the first opening region 460. For example, the elastic member 310 may have a thickness greater than the depth of the first opening region 460.

The second opening region 470 may be formed in the shape of a groove that is open toward the display 400. The second opening region 470 may be connected with the first opening region 460 and may be formed long in a second direction (e.g., the +Y-axis direction) perpendicular to the first direction and a direction opposite to the second direction. When a plurality of second opening regions 470 are formed, one of the plurality of second opening regions 470 may be located on one side of the first opening region 460 (e.g., on one side facing toward the +Y-axis), and one of the remaining second opening regions 470 may be located on an opposite side of the first opening region 460 (e.g., on one side facing toward the −Y-axis).

The second opening region 470 may be connected with a space between the panel conductive layer 430 of the display 400 and the mechanical support part 450. The second opening region 470 may have a depth different from the depth of the first opening region 460. The first opening region 460, in which the elastic member 310 is accommodated, may have a greater depth than the depth of the second opening region 470. A portion of the conductive plate 340 of the conductive member 300 may be accommodated in the second opening region 470. The width and depth of the second opening region 470 may be formed in consideration of the thickness and length of the conductive plate 340.

The conductive member 300 may include the elastic member 310, the conductive plate 340, a first adhesive member 330, and a second adhesive member 320.

The elastic member 310 may absorb shock such as an external force applied to the display 400 or the tension of the display 400 having flexible characteristics. The elastic member 310 may be formed based on either polyurethane foam or polyethylene terephthalate (PET) or a combination thereof.

The elastic member 310 may include a front surface 311 facing in the first direction (e.g., the +Z-axis direction), a rear surface 312 facing in the direction opposite to the first direction, and a plurality of side surfaces 313 formed between the front surface 311 and the rear surface 312. The front surface 311 of the elastic member 310 may be disposed in a higher position than wing regions 341 and 342 of the conductive plate 340, and the rear surface 312 of the elastic member 310 may be disposed in a lower position than the wing regions 341 and 342 of the conductive plate 340.

The elastic member 310 may be formed in various shapes such as a polygonal shape, a circular shape, and an oval shape. The elastic member 310 may be formed in various shapes suitable for shock absorption.

The elastic member 310 may be disposed on a first inner surface 451 of the mechanical support part 450 formed by the first opening region 460. The elastic member 310 may have a height corresponding to the gap between the panel conductive layer 430 of the display 400 and the mechanical support part 450. The elastic member 310 may be accommodated in the first opening region 460 such that the front surface 311 of the elastic member 310 further protrudes beyond the wing regions 341 and 342 of the conductive plate 340 with respect to a front surface (e.g., a surface facing in the +Z-axis direction) of the mechanical support part 450. Since the elastic member 310 is disposed in a space different from the space in which the wing regions 341 and 342 of the conductive plate 340 are disposed, the size of the first opening region 460 in which the elastic member 310 is disposed may be designed without consideration of the sizes of the wing regions 341 and 342. The first opening region 460, in which the elastic member 310 is disposed, may be reduced in size when the elastic member 310 is disposed together with the wing regions 341 and 342.

The first adhesive member 330 may be formed to surround at least a portion of the elastic member 310 and may be disposed between the elastic member 310 and the conductive plate 340. The conductive plate 340 may be stuck to the elastic member 310 through the first adhesive member 330. The first adhesive member 330 may be a polymer that is melted above the melting temperature when heated to a high temperature (e.g., 100 degrees or higher) and that remains in a solid state at room temperature. For example, the first adhesive member 330 may be a hotmelt adhesive.

The second adhesive member 320 may be disposed between the conductive plate 340 and the mechanical support part 450. The second adhesive member 320 may be formed of a material different from the material of the first adhesive member 330. The first adhesive member 330 may be a high-temperature adhesive that exhibits adhesiveness at high temperature, and the second adhesive member 320 may be formed of a room-temperature adhesive that has adhesiveness not only at high temperature but also at room temperature.

According to an embodiment, since the elastic member 310 is not stuck to the conductive plate 340 through the second adhesive member 320, the elastic member 310 may be stuck to the conductive plate 340 through the first adhesive member 330 that is a hotmelt adhesive.

The conductive plate 340 may be disposed on the mechanical support part 450 to seal the first opening region 460. The conductive plate 340 may be electrically connected with the panel conductive layer 430 of the display 400. The conductive plate 340 may be formed of a conductive material and may surround at least a portion of the elastic member 310. The conductive plate 340 may surround at least a portion of the first adhesive member 330 attached to the elastic member 310.

The conductive plate 340 may be formed by plating a non-conductive fabric with a conductive material. For example, the conductive plate 340 may be formed by plating a polyester fabric with copper (Cu) and nickel (Ni) and may be stuck to the elastic member 310 through the first adhesive member 330.

The conductive plate 340 may include a base region 345 (or, a first region), one or more wing regions 341 and 342 (or, second regions), and one or more buffer regions 351 and 352 (or, third regions).

The base region 345 may be attached to the elastic member 310 through the first adhesive member 330. The first adhesive member 330 may be formed on at least a portion of the elastic member 310. For example, the first adhesive member 330 may be formed on the front surface 311 of the elastic member 310 that faces toward the display 400. According to an embodiment, the first adhesive member 330 may be formed on the front surface 311 of the elastic member 310 that faces toward the display 400 and on the rear surface 312 of the elastic member 310 that faces toward the mechanical support part 450. According to an embodiment, the first adhesive member 330 may be formed on the front surface 311, the rear surface 312, and the side surfaces 313 of the elastic member 310.

The base region 345 facing toward the display 400 may be a region making contact with the panel conductive layer 430 of the display 400.

The one or more buffer regions 351 and 352 may be disposed between the wing regions 341 and 342 and the base region 345 so as to be adjacent to the elastic member 310. The one or more buffer regions 351 and 352 may include the first buffer region 351 and the second buffer region 352 that extend from the base region 345 in different directions. The first buffer region 351 may extend from the base region 345 toward the first wing region 341. The second buffer region 352 may extend from the base region 345 toward the second wing region 342.

The one or more buffer regions 351 and 352 may have a length greater than the separation distance between the base region 345 and the wing regions 341 and 342, and at least portions of the one or more buffer regions 351 and 352 may have a bent shape. For example, the one or more buffer regions 351 and 352 may be formed in a shape bent to be convex toward the first opening region 460. Since the first adhesive member 330 is not formed on the at least portions of the one or more buffer regions 351 and 352, the buffer regions 351 and 352 may be spaced apart from at least one of the first adhesive member 330, the elastic member 310, or the mechanical support part 450. Since the at least portions of the one or more buffer regions 351 and 352 are not fixed to at least one of the first adhesive member 330, the elastic member 310, or the mechanical support part 450, movement of the at least portions of the one or more buffer regions 351 and 352 may be facilitated. The buffer regions 351 and 352 may be easily deformed in spaces between the base region 345 fixed to the elastic member 310 by the first adhesive member 330 and the wing regions 341 and 342 fixed to the mechanical support part 450 by the second adhesive member 320. Accordingly, even though the elastic member 310 is excessively pressed above a specified pressure by the display 400, the buffer regions 351 and 352 may be deformed by the pressing force, and thus a damage defect in which the conductive plate 340 is torn may be prevented or reduced.

The one or more wing regions 341 and 342 and the elastic member 310 may be disposed on different surfaces. For example, the one or more wing regions 341 and 342 may be disposed on a second inner surface 452 of the mechanical support part 450 formed by the second opening region 470. The elastic member 310 may be disposed on the first inner surface 451 of the mechanical support part 450 formed by the first opening region 460.

Since the one or more wing regions 341 and 342 are disposed in the space different from the space in which the elastic member 310 is disposed, the one or more wing regions 341 and 342 may be formed to be large in the second opening region 470 (e.g., may be formed to be long in the second direction (the +Y-axis direction) and the direction opposite to the second direction (the +Y-axis direction)) without consideration of the size of the first opening region 460 in which the elastic member 310 is disposed. The one or more wing regions 341 and 342 may stably secure contact areas with the mechanical support part 450, and thus electrical (vertical) resistance between the wing regions 341 and 342 and the mechanical support part 450 may be kept low.

The one or more wing regions 341 and 342 may include the first wing region 341 and the second wing region 342 that extend from the base region 345 in different directions. At least one of the first wing region 341 or the second wing region 342 may extend in a direction crossing the side surfaces 313 of the elastic member 310. The first and second wing regions 341 and 342 and the elastic member 310 may be disposed on different surfaces. The first wing region 341 and the second wing region 342 may be disposed on the second inner surface 452 formed by the second opening region 470, and the elastic member 310 may be disposed on the first inner surface 451 formed by the first opening 460. The first inner surface 451 may be disposed farther away from the panel conductive layer 430 of the display 400 than the second inner surface 452.

The first wing region 341 may include at least one bonding region 341a and at least one adhesion region 341b, and the second wing region 342 may include at least one bonding region 342a and at least one adhesion region 342b.

The bonding regions 341a and 342a may be bonded to the mechanical support part 450 through ultrasonic fusing or laser fusing. The bonding regions 341a and 342a may be melted by ultrasonic waves or a laser and may be fused and bonded to the mechanical support part 450.

The adhesion regions 341b and 342b may be stuck to the mechanical support part 450 through the second adhesive member 320. According to an embodiment, the bonding regions 341a and 342a may be fused to the mechanical support part 450 after the conductive member 300 is fixed to the mechanical support part 450 by being temporarily bonded to the mechanical support part 450 through the second adhesive member 320 attached to the adhesion regions 341b and 342b.

According to an embodiment, as illustrated in FIG. 4A, the second adhesive member 320 may be disposed close to the first opening region 460. The adhesion regions 341b and 342b, to which the second adhesive member 320 is attached, may be disposed closer to the first opening region 460 than the bonding regions 341a and 342a to which the second adhesive member 320 is not attached.

According to an embodiment, as illustrated in FIG. 4B, the second adhesive member 320 may be disposed far away from the first opening region 460. The adhesion regions 341b and 342b, to which the second adhesive member 320 is attached, may be disposed farther away from the first opening region 460 than the bonding regions 341a and 342a to which the second adhesive member 320 is not attached.

As described above, in the electronic device 401 according to this embodiment, the size of the first opening region 460 in which the elastic member 310 is accommodated may be reduced, and thus the rigidity of the mechanical support part 450 may be relatively increased. The electronic device 401 according to this embodiment may stably secure the contact area between the conductive plate 340 accommodated in the second opening region 470 and increased in size and the mechanical support part 450, and thus the electrical (vertical) resistance between the conductive plate 340 and the mechanical support part 450 may be kept low. Accordingly, a decrease in the receiving sensitivity of an RF signal affected by the vertical resistance component (e.g., desense) may be reduced.

Figure 5:
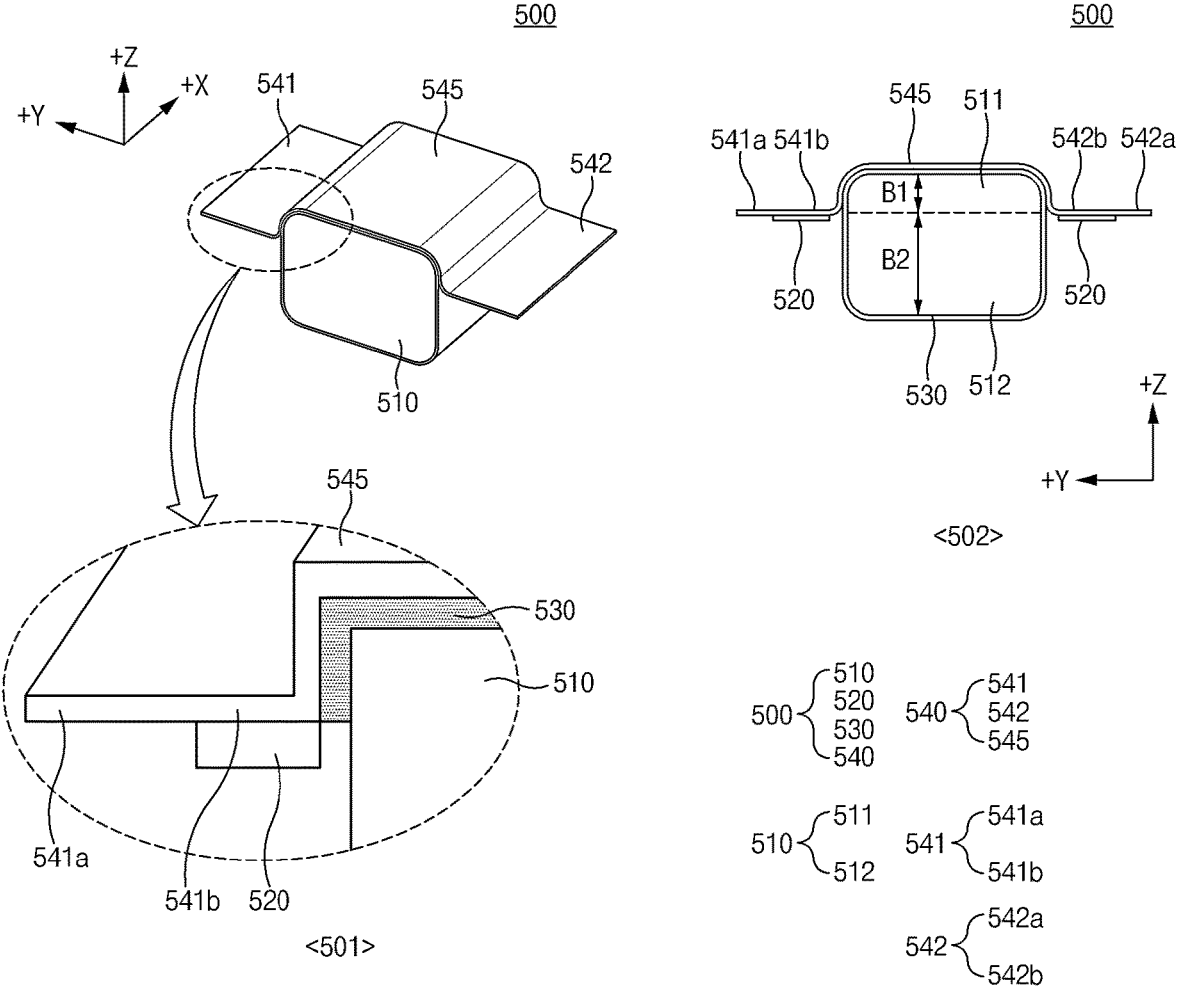
FIG. 5 illustrates views of a conductive member included in an electronic device according to an embodiment.

FIG. 5 illustrates views of a conductive member included in an electronic device according to an embodiment. In FIG. 5, "501" is a perspective view illustrating the conductive member included in the electronic device according to an embodiment, and "502" is a sectional view illustrating the conductive member included in the electronic device according to an embodiment.

Referring to FIG. 5, the conductive member 500 may include an elastic member 510 (e.g., the elastic member 310 of FIGS. 4A and 4B), a conductive plate 540 (e.g., the conductive plate 340 of FIGS. 4A and 4B), a first adhesive member 530 (e.g., the first adhesive member 330 of FIGS. 4A and 4B), and a second adhesive member 520 (e.g., the second adhesive member 320 of FIGS. 4A and 4B).

The elastic member 510 may include a first elastic region 511 and a second elastic region 512. The first elastic region 511 and the second elastic region 512 may be distinguished from each other with respect to wing regions 541 and 542 of the conductive plate 540. At least a portion of the first elastic region 511 may be disposed in a higher position than the wing regions 541 and 542, and at least a portion of the second elastic region 512 may be disposed in a lower position than the wing regions 541 and 542.

The first elastic region 511 and the second elastic region 512 may have the same thickness or different thicknesses. The first elastic region 511 and the second elastic region 512 may be formed of the same material or different materials. For example, the first elastic region 511 and the second elastic region 512 may be integrally formed of the same material and may have different thicknesses. The thickness B2 of the second elastic region 512 accommodated in a mechanical support part (e.g., the mechanical support part 450 of FIGS. 4A and 4B) may be greater than the thickness B1 of the first elastic region 511 disposed to further protrude beyond the mechanical support part.

The conductive plate 540 may be formed to surround at least a portion of the elastic member 510. The conductive plate 540 may be formed to surround the first elastic region 511 of the elastic member 510. The conductive plate 540 may be formed to cover a front surface of the elastic member 510 that faces in a first direction (e.g., the +Z-axis direction), a portion of one side surface of the elastic member 510 that faces a second direction (e.g., the +Y-axis direction) perpendicular to the first direction (e.g., the +Z-axis direction), and a portion of an opposite side surface of the elastic member 510 that faces a direction (e.g., the −Y-axis direction) opposite to the second direction (e.g., the +Y-axis direction) and may be formed so as not to cover a rear surface of the elastic member 510 that faces a direction (e.g., the −Z-axis direction) opposite to the first direction (e.g., the +Z-axis direction).

The conductive plate 540 may include a base region 545 (e.g., the base region 345 of FIGS. 4A and 4B) and one or more wing regions 541 and 542 (e.g., the one or more wing regions 341 and 342 of FIGS. 4A and 4B). The conductive plate 540 may further include one or more buffer regions (e.g., the one or more buffer regions 351 and 352 of FIGS. 4A and 4B) disposed between the base region 545 and the one or more wing regions 541 and 542.

The wing region 541 of the conductive plate 540 may include at least one bonding region 541a (e.g., the bonding region 341a of FIGS. 4A and 4B) and at least one adhesion region 541b (e.g., the adhesion region 341b of FIGS. 4A and 4B), and the wing region 542 of the conductive plate 540 may include at least one bonding region 542a (e.g., the bonding region 342a of FIGS. 4A and 4B) and at least one adhesion region 542b (e.g., the adhesion region 342b of FIGS. 4A and 4B). The bonding regions 541a and 542a may be disposed adjacent to the adhesion regions 541b and 542b. The bonding regions 541a and 542a may be disposed between the adhesion regions 541b and 542b and the base region 545, or the adhesion regions 541b and 542b may be disposed between the bonding regions 541a and 542a and the base region 545.

The adhesion regions 541b and 542b may be stuck to the mechanical support part 450 through the second adhesive member 520.

The bonding regions 541a and 542a may be bonded to the mechanical support part 450 through ultrasonic fusing or laser fusing. The bonding regions 541a and 542a may be melted by heat generated by ultrasonic waves or a laser and may be fused and bonded to the mechanical support part 450.

According to an embodiment, the bonding regions 541a and 542a may be fused to the mechanical support part after the conductive member 500 is temporarily fixed to the mechanical support part 450 by being temporarily bonded to the mechanical support part 450 through the second adhesive member 520 attached to the adhesion regions 541b and 542b.

Figure 6:
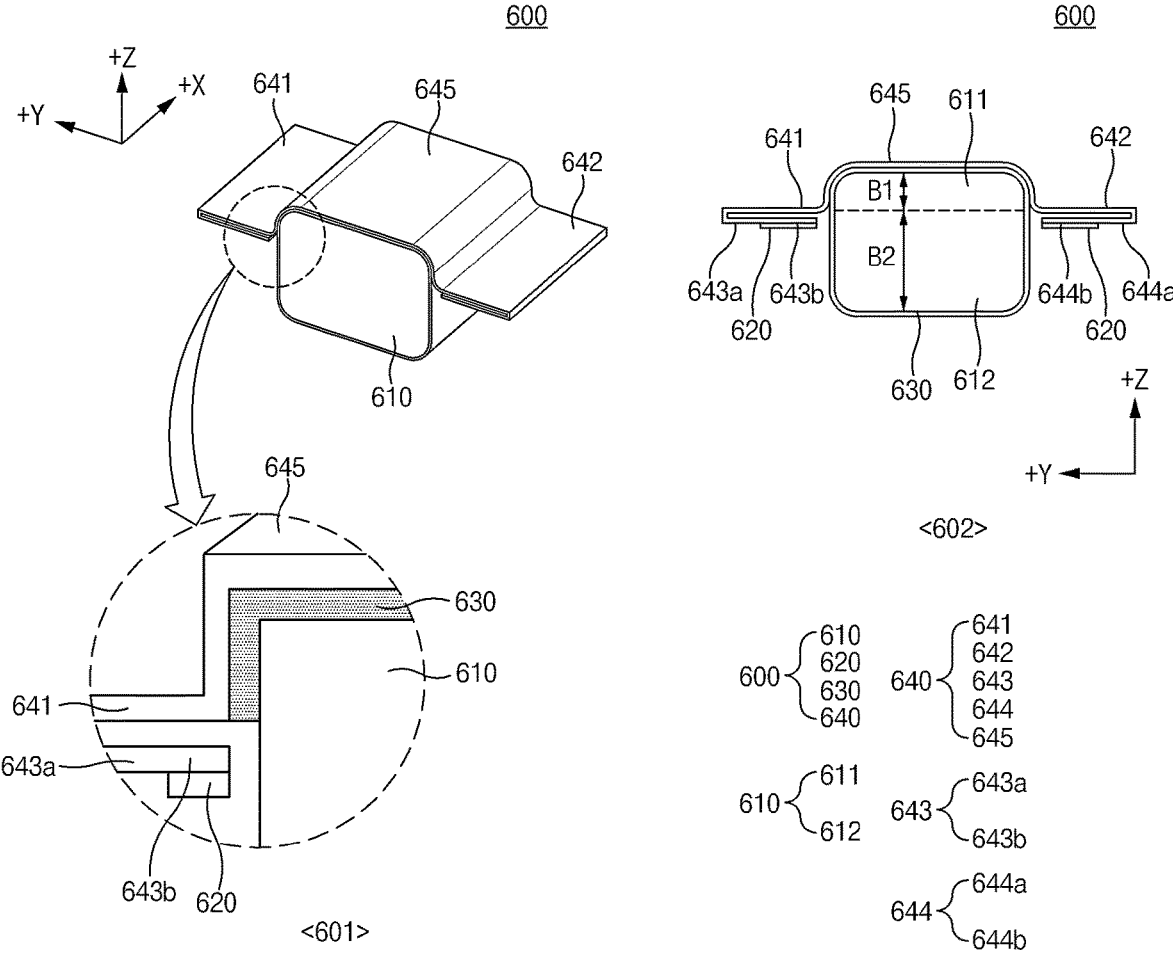
FIG. 6 illustrates views of a conductive member included in an electronic device according to an embodiment.

FIG. 6 illustrates views of a conductive member included in an electronic device according to an embodiment. In FIG. 6, "601" is a perspective view illustrating the conductive member included in the electronic device according to an embodiment, and "602" is a sectional view illustrating the conductive member included in the electronic device according to an embodiment.

Referring to FIG. 6, the conductive member 600 may include an elastic member 610 (e.g., the elastic member 510 of FIG. 5), a conductive plate 640 (e.g., the conductive plate 540 of FIG. 5), a first adhesive member 630 (e.g., the first adhesive member 530 of FIG. 5), and a second adhesive member 620 (e.g., the second adhesive member 520 of FIG. 5). The configuration of the conductive member 500 in FIG. 5 may be applied to the configuration of the conductive member 600 in FIG. 6. The following description will be focused on the difference between the configuration of the conductive plate 540 of the conductive member 500 in FIG. 5 and the configuration of the conductive plate 640 of the conductive member 600 in FIG. 6.

The conductive plate 640 may include a base region 645 (e.g., the base region 545 of FIG. 5), a first wing region 641 (e.g., the first wing region 541 of FIG. 5), a second wing region 642 (e.g., the second wing region 542 of FIG. 5), a third wing region 643, and a fourth wing region 644. According to an embodiment, the conductive plate 640 may further include one or more buffer regions (e.g., the one or more buffer regions 351 and 352 of FIGS. 4A and 4B) disposed between the base region 645 and at least one of the first wing region 641, the second wing region 642, the third wing region 643, or the fourth wing region 644. At least two regions among the first wing region 641, the second wing region 642, the third wing region 643, the fourth wing region 644, the base region 645, and the one or more buffer regions may be integrally formed.

The third wing region 643 may be bent from the first wing region 641 and may be disposed to face a rear surface of the first wing region 641. The third wing region 643 may be attached to a mechanical support part (e.g., the mechanical support part 450 of FIGS. 4A and 4B). An adhesive member having a property the same as or similar to the property of the second adhesive member 620 may be additionally disposed in a partial region between the third wing region 643 and the first wing region 641.

The fourth wing region 644 may be bent from the second wing region 642 and may be disposed to face a rear surface of the second wing region 642. The fourth wing region 644 may be attached to the mechanical support part (e.g., the mechanical support part 450 of FIGS. 4A and 4B). An adhesive member having a property the same as or similar to the property of the second adhesive member 620 may be additionally disposed in a partial region between the fourth wing region 644 and the second wing region 642.

The third wing region 643 may include at least one bonding region 643a and at least one adhesion region 643b, and the fourth wing region 644 may include at least one bonding region 644a and at least one adhesion region 644b. One of the bonding regions 643a and 644a and the adhesion regions 643b and 644b may be disposed relatively close to the elastic member 610, and the other one of the bonding regions 643a and 644a and the adhesion regions 643b and 644b may be disposed relatively far away from the elastic member 610.

The adhesion regions 643*b* and 644*b* may be stuck to the mechanical support part 450 through the second adhesive member 620.

The bonding regions 643*a* and 644*a* may be bonded to the mechanical support part 450 through ultrasonic fusing or laser fusing. The bonding regions 643*a* and 644*a* may be melted by ultrasonic waves or a laser and may be fused and bonded to the mechanical support part 450. During the ultrasonic fusing or the laser fusing, at least a portion of the first wing region 641 may be fused to the bonding region 643*a* of the third wing region 643 and the mechanical support part 450, and at least a portion of the second wing region 642 may be fused to the bonding region 644*a* of the fourth wing region 644 and the mechanical support part 450. Since not only the third wing region 643 and the fourth wing region 644 but also the first wing region 641 and the second wing region 642 are fused during the ultrasonic fusing or the laser fusing, the minimum thickness of the conductive plate 640 required during the fusing process may be secured.

According to an embodiment, the bonding regions 643*a* and 644*a* and the wing regions 641 and 642 may be fused to the mechanical support part 450 after the conductive member 600 is temporarily fixed to the mechanical support part 450 by being temporarily bonded to the mechanical support part 450 through the second adhesive member 620 attached to the adhesion regions 643*b* and 644*b*.

Figure 7:
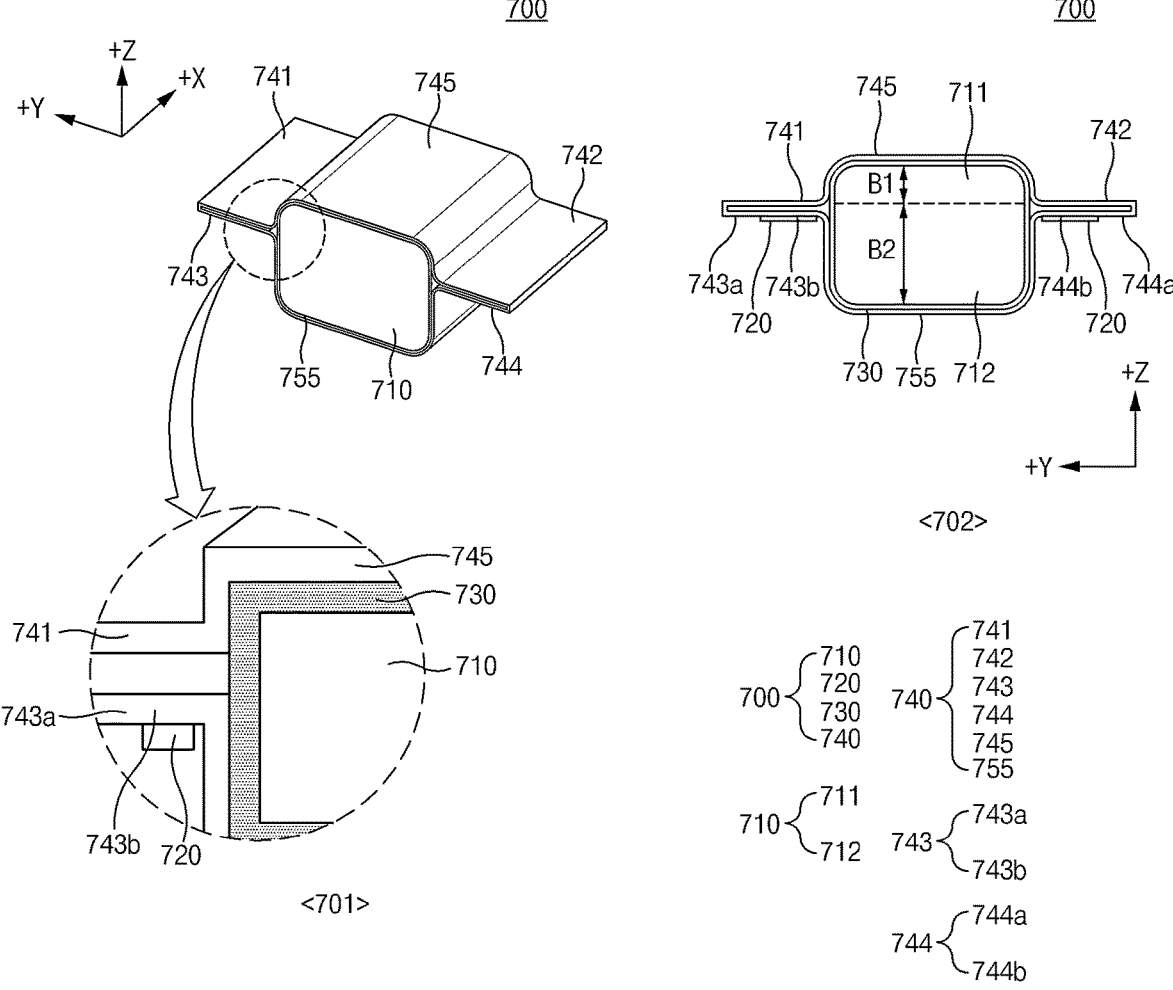
FIG. 7 illustrates views of a conductive member included in an electronic device according to an embodiment.

FIG. 7 illustrates views of a conductive member included in an electronic device according to an embodiment. In FIG. 7, "701" is a perspective view illustrating the conductive member included in the electronic device according to an embodiment, and "702" is a sectional view illustrating the conductive member included in the electronic device according to an embodiment.

Referring to FIG. 7, the conductive member 700 may include an elastic member 710 (e.g., the elastic member 510 of FIG. 5), a conductive plate 740 (e.g., the conductive plate 540 of FIG. 5), a first adhesive member 730 (e.g., the first adhesive member 530 of FIG. 5), and a second adhesive member 720 (e.g., the second adhesive member 520 of FIG. 5). The configuration of the conductive member 500 in FIG. 5 may be applied to the configuration of the conductive member 700 in FIG. 7. The following description will be focused on the difference between the configuration of the conductive plate 540 of the conductive member 500 in FIG. 5 and the configuration of the conductive plate 740 of the conductive member 700 in FIG. 7.

The conductive plate 740 may be formed to surround a first elastic region 711 and a second elastic region 712 of the elastic member 710. The conductive plate 740 may include a first base region 745 (e.g., the base region 545 of FIG. 5), a second base region 755, a first wing region 741 (e.g., the first wing region 541 of FIG. 5), a second wing region 742 (e.g., the second wing region 542 of FIG. 5), a third wing region 743, and a fourth wing region 744. The first base region 745, the second base region 755, the first and second wing regions 741 and 742, and the third and fourth wing regions 743 and 744 may be integrally formed. In addition, the conductive plate 740 may further include one or more buffer regions (e.g., the one or more buffer regions 351 and 352 of FIGS. 4A and 4B). The one or more buffer regions may be formed between one of the first wing region 741 and the second wing region 742 and the first base region 745 and/or between one of the third wing region 743 and the fourth wing region 744 and the second base region 755.

The first base region 745 may be formed to surround the first elastic region 711 of the elastic member 710.

The second base region 755 may be formed to surround the second elastic region 712 of the elastic member 710. The second base region 755 may be formed to overlap the first base region 745 with the elastic member 710 therebetween. The second base region 755 may be formed between the third wing region 743 and the fourth wing region 744.

The third wing region 743 may be disposed between the first wing region 741 and the second base region 755. The third wing region 743 may be bent from the first wing region 741 and may be disposed to face a rear surface of the first wing region 741. The third wing region 743 may be attached to a mechanical support part (e.g., the mechanical support part 450 of FIGS. 4A and 4B).

The fourth wing region 744 may be disposed between the second wing region 742 and the second base region 755. The fourth wing region 744 may be bent from the second wing region 742 and may be disposed to face a rear surface of the second wing region 742. The fourth wing region 744 may be attached to the mechanical support part (e.g., the mechanical support part 450 of FIGS. 4A and 4B).

The third wing region 743 may include at least one bonding region 743*a* and at least one adhesion region 743*b*, and the fourth wing region 744 may include at least one bonding region 744*a* and at least one adhesion region 744*b*. The adhesion regions 743*b* and 744*b* may be regions corresponding to the second adhesive member 720. One of the bonding regions 743*a* and 744*a* and the adhesion regions 743*b* and 744*b* may be disposed close to the elastic member 710, and the other one of the bonding regions 743*a* and 744*a* and the adhesion regions 743*b* and 744*b* may be disposed far away from the elastic member 710.

The adhesion regions 743*b* and 744*b* may be stuck to the mechanical support part through the second adhesive member 720.

The bonding regions 743*a* and 744*a* may be bonded to the mechanical support part 450 through ultrasonic fusing or laser fusing. The bonding regions 743*a* and 744*a* may be melted by heat generated by ultrasonic waves or a laser and may be fused and bonded to the mechanical support part 450. During the ultrasonic fusing or the laser fusing, at least a portion of the first wing region 741 may be fused to the bonding region 743*a* of the third wing region 743 and the mechanical support part 450, and at least a portion of the second wing region 742 may be fused to the bonding region 744*a* of the fourth wing region 744 and the mechanical support part 450. Since not only the third wing region 743 and the fourth wing region 744 but also the first wing region 741 and the second wing region 742 are fused during the ultrasonic fusing or the laser fusing, the minimum thickness of the conductive plate 740 required during the fusing process may be secured.

According to an embodiment, the bonding regions 743*a* and 744*a* and the wing regions 741 and 742 may be fused to the mechanical support part after the conductive member 700 is temporarily fixed to the mechanical support part by being temporarily bonded to the mechanical support part through the second adhesive member 720 attached to the adhesion regions 743*b* and 744*b*.

Figure 8:
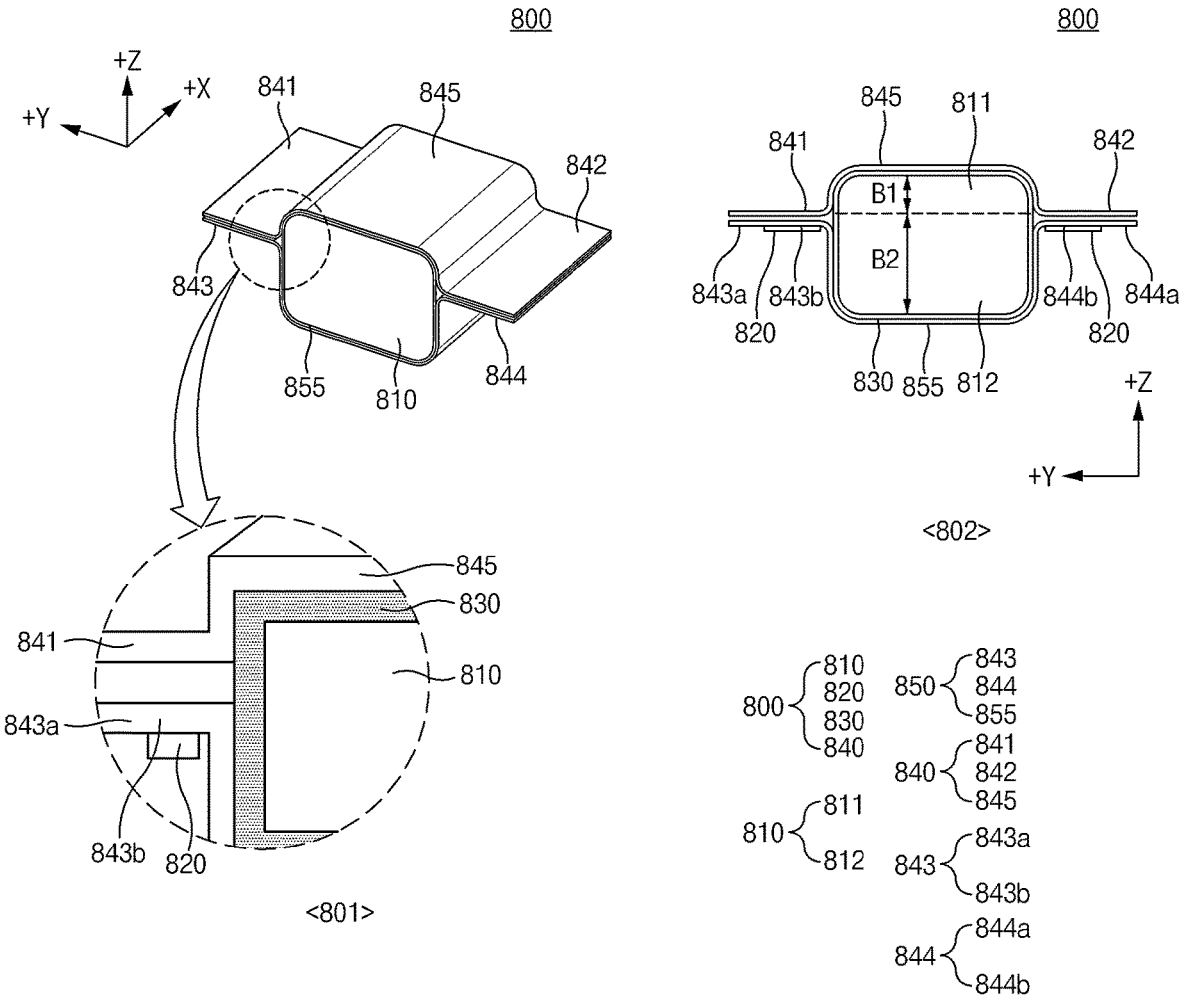
FIG. 8 illustrates views of a conductive member included in an electronic device according to an embodiment.

FIG. 8 illustrates views of a conductive member included in an electronic device according to an embodiment. In FIG. 8, "801" is a perspective view illustrating the conductive member included in the electronic device according to an embodiment, and "802" is a sectional view illustrating the conductive member included in the electronic device according to an embodiment.

Referring to FIG. 8, the conductive member 800 may include an elastic member 810 (e.g., the elastic member 510 of FIG. 5), a first conductive plate 840 (e.g., the conductive plate 540 of FIG. 5), a second conductive plate 850, a first adhesive member 830 (e.g., the first adhesive member 530 of FIG. 5), and a second adhesive member 820 (e.g., the second adhesive member 520 of FIG. 5). The configuration of the conductive member 500 in FIG. 5 may be applied to the configuration of the conductive member 800 in FIG. 8. The following description will be focused on the difference between the configuration of the conductive plate 540 of the conductive member 500 in FIG. 5 and the configuration of the conductive plate 840 of the conductive member 800 in FIG. 8.

Each of the first conductive plate 840 and the second conductive plate 850 may be formed to surround at least a portion of the elastic member 810. The first conductive plate 840 may be formed to surround a first elastic region 811 of the elastic member 810. The second conductive plate 850 may be formed to surround a second elastic region 812 of the elastic member 810.

The first conductive plate 840 and the second conductive plate 850 may be formed of the same material or different materials. An adhesive member having adhesive characteristics the same as or similar to those of the second adhesive member 820 may be additionally disposed in a partial region between the first conductive plate 840 and the second conductive plate 850. The additional adhesive member may be disposed to overlap the second adhesive member 820.

The first conductive plate 840 may include a first base region 845 (e.g., the base region 545 of FIG. 5), a first wing region 841 (e.g., the first wing region 541 of FIG. 5), and a second wing region 842 (e.g., the second wing region 542 of FIG. 5). The first base region 845, the first wing region 841, and the second wing region 842 may be integrally formed.

The second conductive plate 850 may include a second base region 855, a third wing region 843, and a fourth wing region 844. The second base region 855, the third wing region 843, and the fourth wing region 844 may be integrally formed. According to an embodiment, at least one of the first conductive plate 840 or the second conductive plate 850 may further include one or more buffer regions (e.g., the one or more buffer regions 351 and 352 of FIGS. 4A and 4B).

The second base region 855 may be formed to surround the second elastic region 812 of the elastic member 810. The second base region 855 may be formed to overlap the first base region 845 with the elastic member 810 therebetween. The second base region 855 may be formed between the third wing region 843 and the fourth wing region 844.

The third wing region 843 may extend from one side of the second base region 855. The fourth wing region 844 may extend from an opposite side of the second base region 855.

The third wing region 843 may include at least one bonding region 843a and at least one adhesion region 843b, and the fourth wing region 844 may include at least one bonding region 844a and at least one adhesion region 844b. The adhesion regions 843b and 844b may be regions corresponding to the second adhesive member 820.

One of the bonding regions 843a and 844a and the adhesion regions 843b and 844b may be disposed close to the elastic member 810, and the other one of the bonding regions 843a and 844a and the adhesion regions 843b and 844b may be disposed far away from the elastic member 810.

The adhesion regions 843b and 844b may be stuck to a mechanical support part through the second adhesive member 820.

The bonding regions 843a and 844a may be bonded to the mechanical support part through ultrasonic fusing or laser fusing. The bonding regions 843a and 844a may be melted by ultrasonic waves or a laser and may be fused and bonded to the mechanical support part. During the ultrasonic fusing or the laser fusing, the bonding region 843a of the third wing region 843 may be fused to the mechanical support part 450 together with at least a portion of the first wing region 841, and the bonding region 844a of the fourth wing region 844 may be fused to the mechanical support part 450 together with at least a portion of the second wing region 842. Since the first wing region 841 and the third wing region 843 are fused together and the second wing region 842 and the fourth wing region 844 are fused together during the ultrasonic fusing or the laser fusing, the minimum thickness of the conductive plate 840 required during the fusing process may be secured.

According to an embodiment, the bonding regions 843a and 844a and the wing regions 841, 842, 843, and 844 may be fused to the mechanical support part 450 after the conductive member 800 is fixed to the mechanical support part by being temporarily bonded to the mechanical support part 450 through the second adhesive member 820 attached to the adhesion regions 843b and 844b.

Figure 9:
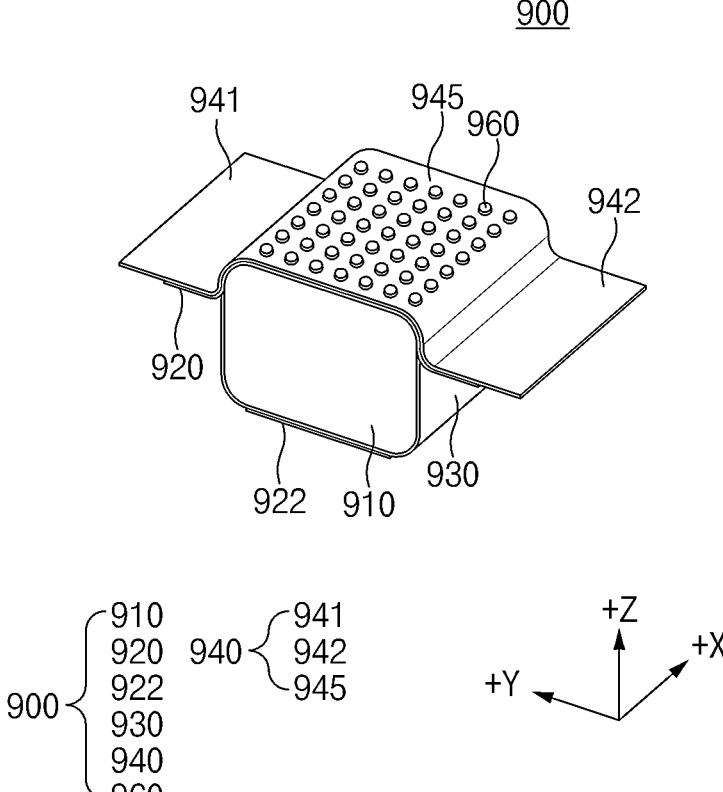
FIG. 9 is a view illustrating a conductive member included in an electronic device according to an embodiment.

FIG. 9 illustrates views of a conductive member included in an electronic device according to an embodiment.

Referring to FIG. 9, the conductive member 900 may include an elastic member 910 (e.g., the elastic member 510 of FIG. 5), a conductive plate 940 (e.g., the conductive plate 540 of FIG. 5), a first adhesive member 930 (e.g., the first adhesive member 530 of FIG. 5), a second adhesive member 920 (e.g., the second adhesive member 520 of FIG. 5), a third adhesive member 922, and a plurality of protrusions 960. The configuration of the conductive member 500 in FIG. 5 may be applied to the configuration of the conductive member 900 in FIG. 9. Hereinafter, the conductive plate 940 and the plurality of protrusions 960 of the conductive member 900 of FIG. 9 will be described focusing on the difference from the configuration of the conductive plate 540 of the conductive member 500 of FIG. 5.

The conductive plate 940 may be brought into contact with the elastic member 910 through the first adhesive member 930, may be attached to a second inner surface (e.g., the second inner surface 452 of FIGS. 4A and 4B) of a mechanical support part (e.g., the mechanical support part 450 of FIGS. 4A and 4B) through the second adhesive member 920, and may be attached to a first inner surface (e.g., the first inner surface 451 of FIGS. 4A and 4B) of the mechanical support part through the third adhesive member 922. The third adhesive member 922 may be formed of a material having adhesive characteristics the same as or similar to those of the second adhesive member 920.

The protrusions 960 may be formed on a surface of the conductive plate 940 that makes contact with a panel conductive layer (e.g., the panel conductive layer 430 of FIGS. 4A and 4B) of a display (e.g., the display 400 of FIGS. 4A and 4B). The protrusions 960 may be formed on a surface of the conductive plate 940 that is not fused to the mechanical support part while making contact with the panel conductive layer of the display. The protrusions 960 may be formed on a surface of a base region 945. Portions of the base region 945 may protrude in a first direction (e.g., the +Z-axis direction) to form the protrusions 960, or separate structures having conductivity may be disposed on the base region 945 so as to protrude in the first direction to form the protrusions 960.

The protrusions 960 may protrude from the surface of the base region 945 toward the panel conductive layer of the display. The protrusions 960 may further protrude beyond the surface of the base region 945 between the protrusions 960.

The protrusions 960 may make contact with the panel conductive layer of the display. The protrusions 960 may be regularly or irregularly arranged in an embossing pattern, a concave-convex pattern, or a pattern having a specific shape.

The protrusions 960 may make electrical contact with the panel conductive layer of the display even though portions of the adhesive members 920, 922, and 930 within the conductive member 900 are introduced into the base region 945. Accordingly, the resistance between the panel conductive layer of the display and the conductive member 900 may be kept low, and thus the conductivity between the panel conductive layer of the display and the conductive member 900 may be increased.

Figure 10A:
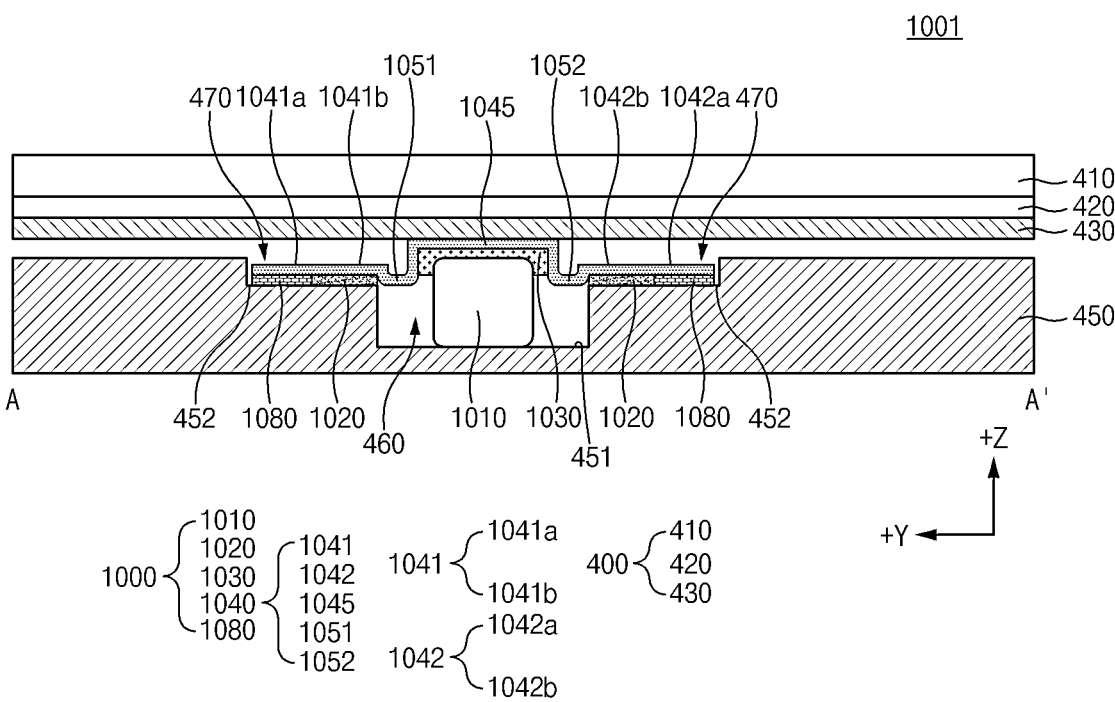
FIGS. 10A and 10B are sectional views illustrating portions of electronic devices according to an embodiment.
Figure 10B:
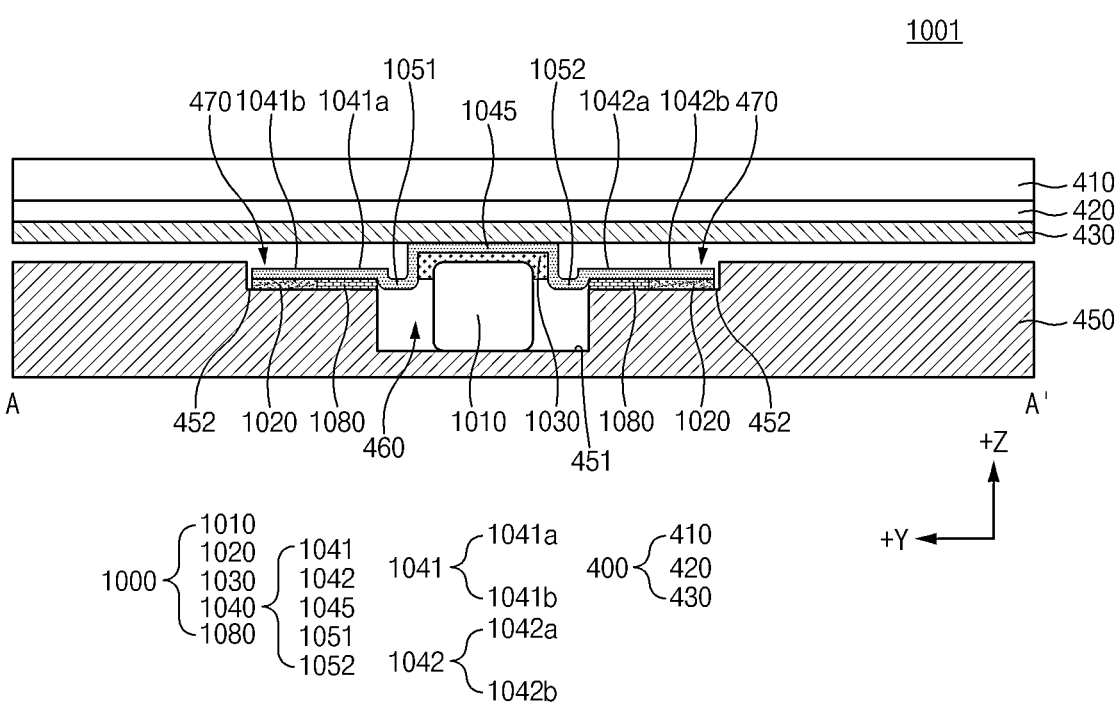

FIGS. 10A and 10B are sectional views illustrating a portion of an electronic device according to an embodiment. The electronic device 1001 illustrated in FIGS. 10A and 10B may be at least partially similar to the electronic device 101 illustrated in FIGS. 1 to 3, or may further include other embodiments.

Referring to FIGS. 10A and 10B, the electronic device 1001 according to an embodiment may include a display 400 (e.g., the display 106 of FIGS. 1 and 2), a mechanical support part 450 (e.g., the metal bracket 140 of FIG. 3), and a conductive member 1000 (e.g., the conductive member 300 of FIGS. 4A and 4B). The electronic device 1001 may include other embodiments in which at least some of the components are omitted or other components are added. The configuration of the electronic device 401 of FIGS. 4A and 4B may be applied to the configuration of the electronic device 1001 of FIGS. 10A and 10B. The following description will be focused on the difference between the configuration of the conductive member 300 in FIGS. 4A and 4B and the configuration of the conductive member 1000 in FIGS. 10A and 10B.

The conductive member 1000 may include an elastic member 1010, a first adhesive member 1030, a second adhesive member 1020, a conductive plate 1040, and a conductive sheet 1080. The configuration of the elastic member 310, the first adhesive member 330, the second adhesive member 320, and the conductive plate 340 of FIGS. 4A and 4B may be applied to the elastic member 1010, the first adhesive member 1030, the second adhesive member 1020, and the conductive plate 1040 of FIGS. 10A and 10B.

The conductive plate 1040 may include a base region 1045 (e.g., the base region 345 of FIGS. 4A and 4B), one or more wing regions 1041 and 1042 (e.g., the wing regions 341 and 342 of FIGS. 4A and 4B), and one or more buffer regions 1051 and 1052 (e.g., the buffer regions 351 and 352 of FIGS. 4A and 4B).

The conductive sheet 1080 may be disposed on a second inner surface 452 of the mechanical support part 450 so as to be adjacent to the second adhesive member 1020. The conductive sheet 1080 may have a thickness that is the same as or similar to the thickness of the second adhesive member 1020. The wing regions 1041 and 1042 of the conductive plate 1040 formed over the conductive sheet 1080 and the second adhesive member 1020 may be disposed flat on the conductive sheet 1080 and the second adhesive member 1020 without flexure.

According to an embodiment, as illustrated in FIG. 10A, the conductive sheet 1080 may be disposed along the edge of the conductive plate 1040 and may be disposed far away from the elastic member 1010 accordingly. The second adhesive member 1020 may be disposed between the conductive sheet 1080 and the elastic member 1010 and may be disposed close to the elastic member 1010 accordingly. According to an embodiment, as illustrated in FIG. 10B, the conductive sheet 1080 may be disposed between the second adhesive member 1020 and the elastic member 1010 and may be disposed close to the elastic member 1010 accordingly.

The conductive sheet 1080 may be disposed between the conductive plate 1040 and the mechanical support part 450. The conductive sheet 1080 may fill empty spaces between bonding regions 1041*a* and 1042*a* of the wing regions 1041 and 1042 of the conductive plate 1040 and the second inner surface 452 of the mechanical support part 450. An ultrasonic fusing process or a laser fusing process may be performed in a state in which an air layer does not exist between the second inner surface 452 of the mechanical support part 450 and the conductive plate 1040. The bonding regions 1041*a* and 1042*a* of the wing regions 1041 and 1042 may be fused to the mechanical support part 450 together with the conductive sheet 1080. Since the conductive plate 1040 makes electrical contact with the mechanical support part 450 through the conductive sheet 1080 without an air layer that is a resistance component, electrical resistance between the conductive plate 1040 and the mechanical support part 450 may be lowered.

The conductive sheet 1080 may have a thickness that is the same as or different from the thickness of the conductive plate 1040. For example, the conductive sheet 1080 may have a greater thickness than the conductive plate 1040. Even though the conductive plate 1040 is thin, the minimum thickness of the conductive plate 1040 required during the ultrasonic fusing process or the laser fusing process may be secured through the conductive sheet 1080. The ultrasonic fusing process or the laser fusing process may be stably performed through the conductive sheet 1080 that compensates for the thickness of the conductive plate 1040.

Figure 11:
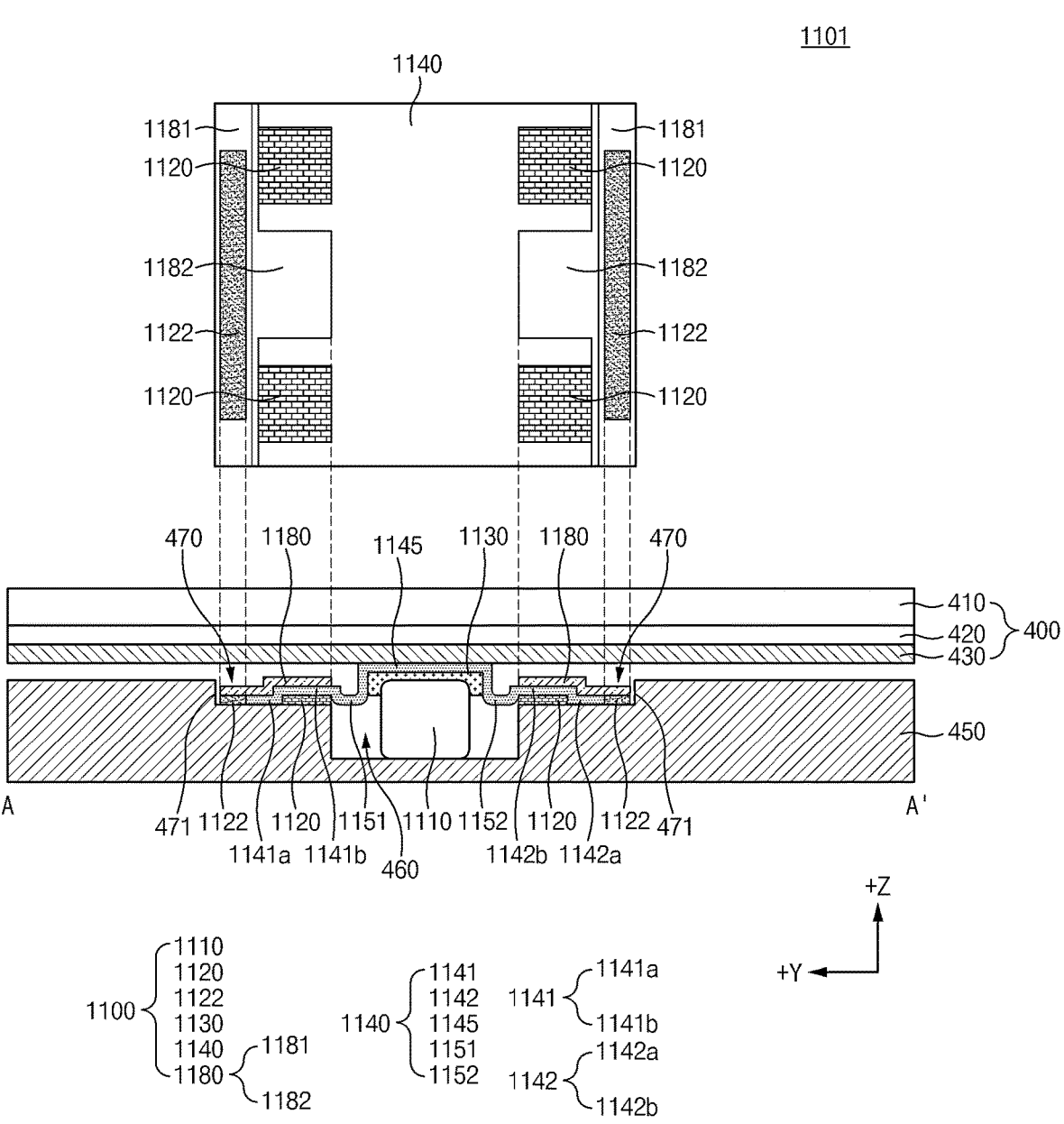
FIG. 11 is a sectional view illustrating a portion of an electronic device according to an embodiment.

FIG. 11 is a sectional view illustrating a portion of an electronic device according to an embodiment. The electronic device 1101 illustrated in FIG. 11 may be at least partially similar to the electronic device 101 illustrated in FIGS. 1 to 3, or may further include other embodiments.

Referring to FIG. 11, the electronic device 1101 according to an embodiment may include a display 400 (e.g., the display 106 of FIGS. 1 and 2), a mechanical support part 450 (e.g., the metal bracket 140 of FIG. 3), and a conductive member 1100 (e.g., the conductive member 300 of FIGS. 4A and 4B). The electronic device 1101 may include other embodiments in which at least some of the components are omitted or other components are added. The configuration of the electronic device 401 of FIGS. 4A and 4B may be applied to the configuration of the electronic device 1101 of FIG. 11. The following description will be focused on the difference between the configuration of the conductive member 300 in FIGS. 4A and 4B and the configuration of the conductive member 1100 in FIG. 11.

The conductive member 1100 may include an elastic member 1110, a first adhesive member 1130, a second adhesive member 1120, a third adhesive member 1122, a conductive plate 1140, and a conductive sheet 1180. The configuration of the elastic member 310, the first adhesive member 330, the second adhesive member 320, and the conductive plate 340 of FIGS. 4A and 4B may be applied to the elastic member 1110, the first adhesive member 1130, the second adhesive member 1120, and the conductive plate 1140 of FIG. 11.

The conductive plate 1040 may include a base region 1145 (e.g., the base region 345 of FIGS. 4A and 4B), one or more wing regions 1141 and 1142 (e.g., the wing regions 341 and 342 of FIGS. 4A and 4B), and one or more buffer regions 1151 and 1152 (e.g., the buffer regions 351 and 352 of FIGS. 4A and 4B).

The conductive sheet 1180 may be disposed on at least a portion of the conductive plate 1140. The conductive sheet 1180 may be formed on the remaining region of the conductive plate 1140 other than the region overlapping the elastic member 1110. The conductive sheet 1180 may not be formed on the base region 1145 and the buffer regions 1151 and 1152. A decrease in the restoring force of the elastic member 1110 may be prevented or reduced by the rigidity of the conductive sheet 1180.

The conductive sheet 1180 may be formed to cover the wing regions 1141 and 1142 of the conductive plate 1140. The conductive sheet 1180 may press the wing regions 1141 and 1142 of the conductive plate 1140. The conductive sheet 1180 may fix the positions of the wing regions 1141 and 1142 of the conductive plate 1140 in a fusing process of connecting the conductive plate 1140 and the mechanical support part 450.

The conductive sheet 1180 may extend so as to be closer to an inner surface 471 formed by a second opening 470 than the conductive plate 1140. One portion of the conductive sheet 1180 may not overlap the wing regions 1141 and 1142 of the conductive plate 1040, and another portion of the conductive sheet 1180 may overlap the wing regions 1141 and 1142 of the conductive plate 1040. The portion of the conductive sheet 1180 that does not overlap the wing regions 1141 and 1142 of the conductive plate 1040 may be attached to the mechanical support part 450 through the third adhesive member 1122. The portion of the conductive sheet 1180 that does not overlap the wing regions 1141 and 1142 of the conductive plate 1040 may be bonded to the mechanical support part 450 together with the conductive plate 1140 through a fusing process.

The conductive sheet 1180 may include a first conductive region 1181 and a second conductive region 1182. The first conductive region 1181 may not overlap the wing regions 1141 and 1142 of the conductive plate 1140. The first conductive region 1181 may be attached to the mechanical support part 450 through the third adhesive member 1122. The third adhesive member 1122 may be formed of a material that is the same as or different from the material of the second adhesive member 1120. For example, the third adhesive member 1122 may be formed of the same material as that of the second adhesive member 1120. The third adhesive member 1122 may be spaced apart from the second adhesive member 1120.

The second conductive region 1182 may protrude from the first conductive region 1181 toward the base region 1145. The second conductive region 1182 may protrude to the region between the second adhesive members 1120. The second conductive region 1182 may overlap portions of the wing regions 1141 and 1142 of the conductive plate 1140. The second conductive region 1182 may overlap bonding regions 1141*a* and 1142*a* of the wing regions 1141 and 1142 of the conductive plate 1140. The second conductive region 1182 may be a region to which a laser or ultrasonic waves are applied in a fusing process of the mechanical support part 450 and the conductive plate 1140. The fusing process may be performed in a state in which adhesion regions 1141*b* and 1142*b* of the wing regions 1141 and 1142 are fixed to the mechanical support part 450 through the second adhesive member 1120 and the first conductive region 1181 is fixed to the mechanical support part 450 through the third adhesive member 1122. During the fusing process, the second conductive region 1182 may be fused to the mechanical support part 450 together with the bonding regions 1141*a* and 1142*a* of the wing regions 1141 and 1142.

The conductive sheet 1180 may have a thickness that is the same as or different from the thickness of the conductive plate 1140. For example, the conductive sheet 1180 may have a greater thickness than the conductive plate 1140. Even though the conductive plate 1140 is thin, the minimum thickness of the conductive plate 1140 required during an ultrasonic fusing process or a laser fusing process may be secured through the conductive sheet 1180. The ultrasonic fusing process or the laser fusing process may be stably performed through the conductive sheet 1180 that compensates for the thickness of the conductive plate 1140.

Figure 12:
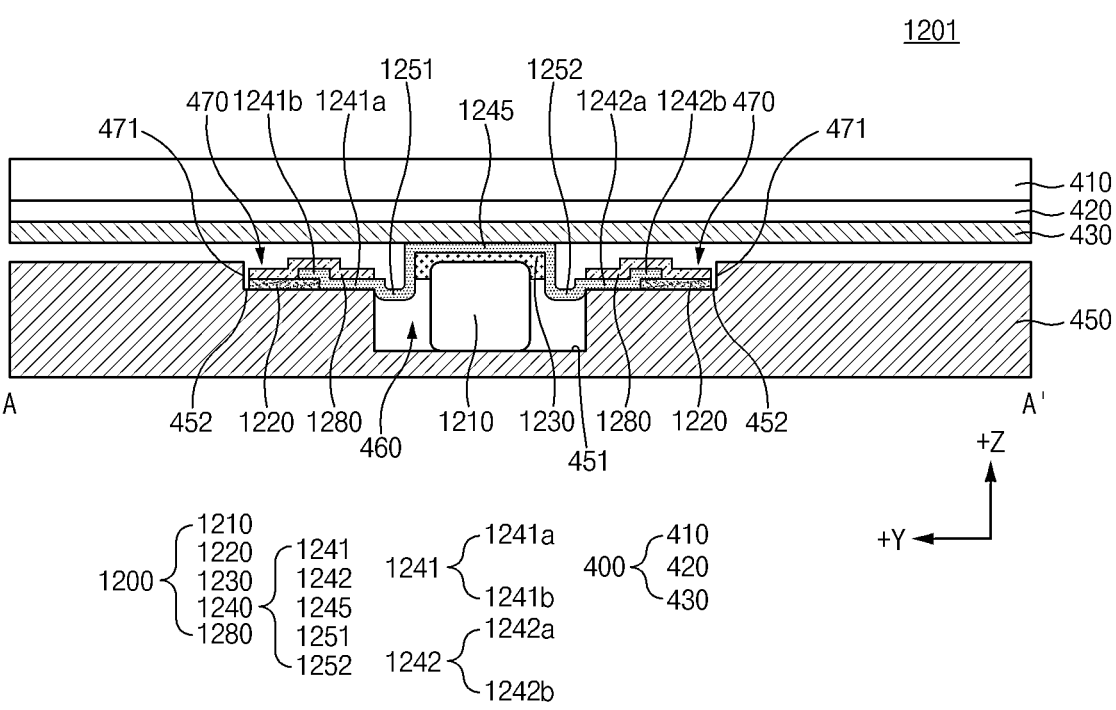
FIG. 12 is a sectional view illustrating a portion of an electronic device according to an embodiment.

FIG. 12 is a sectional view illustrating a portion of an electronic device according to an embodiment. The electronic device 1201 illustrated in FIG. 12 may be at least partially similar to the electronic device 101 illustrated in FIGS. 1 to 3, or may further include other embodiments.

Referring to FIG. 12, the electronic device 1201 according to an embodiment may include a display 400 (e.g., the display 106 of FIGS. 1 and 2), a mechanical support part 450 (e.g., the metal bracket 140 of FIG. 3), and a conductive member 1200 (e.g., the conductive member 300 of FIGS. 4A and 4B). The electronic device 1201 may include other embodiments in which at least some of the components are omitted or other components are added. The configuration of the electronic device 401 of FIGS. 4A and 4B may be applied to the configuration of the electronic device 1201 of FIG. 12. The following description will be focused on the difference between the configuration of the conductive member 300 in FIGS. 4A and 4B and the configuration of the conductive member 1200 in FIG. 12.

The conductive member 1200 may include an elastic member 1210, a first adhesive member 1230, a second adhesive member 1220, a conductive plate 1240, and a conductive sheet 1280. The configuration of the elastic member 310, the first adhesive member 330, the second adhesive member 320, and the conductive plate 340 of FIGS. 4A and 4B may be applied to the elastic member 1210, the first adhesive member 1230, the second adhesive member 1220, and the conductive plate 1240 of FIG. 12.

The second adhesive member 1220 may be disposed between the mechanical support part 450 and portions of the conductive plate 1240 and the conductive sheet 1280. The portions of the conductive plate 1240 and the conductive sheet 1280 may be attached to the mechanical support part 450 through the second adhesive member 1220.

The conductive plate 1240 may include a base region 1245 (e.g., the base region 345 of FIGS. 4A and 4B), one or more wing regions 1241 and 1242 (e.g., the wing regions 341 and 342 of FIGS. 4A and 4B), and one or more buffer regions 1251 and 1252 (e.g., the buffer regions 351 and 352 of FIGS. 4A and 4B).

The conductive sheet 1280 may be formed on the second adhesive member 1220, the first wing region 1241, and the second wing region 1242. The conductive sheet 1280 may press the first wing region 1241 and the second wing region 1242 of the conductive plate 1240. The conductive sheet 1280 may fix the positions of the wing regions 1241 and 1242 of the conductive plate 1240 in a fusing process of connecting the conductive plate 1240 and the mechanical support part 450.

The conductive sheet 1280 may not be formed on the base region 1245, which overlaps the elastic member 1210, and the buffer regions 1251 and 1252. A decrease in the restoring force of the elastic member 1210 may be prevented or reduced by the rigidity of the conductive sheet 1280.

The conductive sheet 1280 may extend so as to be closer to an inner surface 471 formed by a second opening 470 than the conductive plate 1240. The portion of the conductive sheet 1280 that extends beyond the conductive plate 1240 may not overlap the wing regions 1241 and 1242. The portion of the conductive sheet 1280 that does not overlap the wing regions 1241 and 1242 of the conductive plate 1240 may be attached to the mechanical support part 450 through the third adhesive member 1220.

The conductive sheet 1280 may overlap portions of the wing regions 1241 and 1242 of the conductive plate 1240. The conductive sheet 1280 may overlap bonding regions 1241*a* and 1242*a* of the wing regions 1241 and 1242 of the conductive plate 1240. The conductive sheet 1280 may be a region to which a laser or ultrasonic waves are applied in a fusing process of the mechanical support part 450 and the conductive plate 1240. The fusing process may be performed in a state in which adhesion regions 1241*b* and 1242*b* of the wing regions 1241 and 1242 and the conductive sheet 1280 are fixed to the mechanical support part 450 through the second adhesive member 1220. During the fusing process, the conductive sheet 1280 may be fused to the mechanical support part 450 together with the bonding regions 1241*a* and 1242*a* of the wing regions 1241 and 1242.

The conductive sheet 1280 may have a thickness that is the same as or different from the thickness of the conductive plate 1240. For example, the conductive sheet 1280 may have a greater thickness than the conductive plate 1240. Even though the conductive plate 1240 is thin, the minimum thickness of the conductive plate 1240 required during an ultrasonic fusing process or a laser fusing process may be secured through the conductive sheet 1280. The ultrasonic fusing process or the laser fusing process may be stably performed through the conductive sheet 1280 that compensates for the thickness of the conductive plate 1240.

Figure 13:
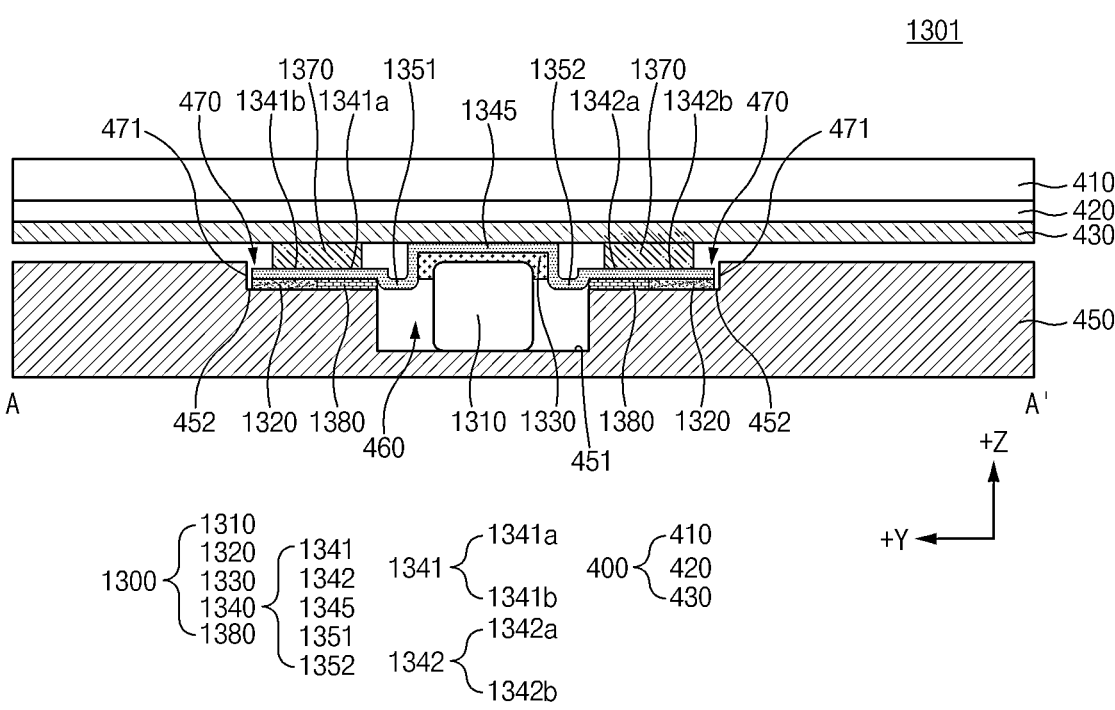
FIG. 13 is a sectional view illustrating a portion of an electronic device according to an embodiment.

FIG. 13 is a sectional view illustrating a portion of an electronic device according to an embodiment. The electronic device 1301 illustrated in FIG. 13 may be at least partially similar to the electronic device 101 illustrated in FIGS. 1 to 3, or may further include other embodiments.

Referring to FIG. 13, the electronic device 1301 according to an embodiment may include a display 400 (e.g., the display 106 of FIGS. 1 and 2), a mechanical support part 450 (e.g., the metal bracket 140 of FIG. 3), and a conductive member 1300 (e.g., the conductive member 300 of FIGS. 4A and 4B). The electronic device 1301 may include other embodiments in which at least some of the components are omitted or other components are added. The configuration of the electronic device 1001 of FIG. 10B may be applied to the configuration of the electronic device 1301 of FIG. 13. The following description will be focused on the difference between the configuration of the conductive member 1100 in FIG. 10B and the configuration of the conductive member 1300 in FIG. 13.

The conductive member 1300 may include an elastic member 1310, a first adhesive member 1330, a second adhesive member 1320, a conductive plate 1340, a conductive sheet 1380, and a compensation member 1370. The configuration of the elastic member 1010, the first adhesive member 1030, the second adhesive member 1020, the conductive plate 1040, and the conductive sheet 1080 of FIG. 10B may be applied to the elastic member 1310, the first adhesive member 1330, the second adhesive member 1320, the conductive plate 1340, and the conductive sheet 1380 of FIG. 13.

The conductive plate 1340 may include a base region 1345 (e.g., the base region 1045 of FIG. 10B), one or more wing regions 1341 and 1342 (e.g., the wing regions 1041 and 1042 of FIG. 10B), and one or more buffer regions 1351 and 1352 (e.g., the buffer regions 1051 and 1052 of FIG. 10B).

Bonding regions 1341*a* and 1342*a* of the first and second wing regions 1341 and 1342 may be fused and bonded to the mechanical support part 450 together with the conductive sheet 1380. Adhesion regions 1341*b* and 1342*b* of the first and second wing regions 1341 and 1342 may be stuck to the mechanical support part 450 through the second adhesive member 1320.

The compensation member 1370 may be disposed on at least one of the first wing region 1341 or the second wing region 1342. The compensation member 1370 may compensate for a difference in height between the first and second wing regions 1341 and 1342 and the base region 1345. For example, the compensation member 1370 may be a waterproof member. When the compensation member 1370 is formed of a waterproof member, the compensation member 1370 may be formed wide along the first wing region 1341 and the second wing region 1342. Accordingly, the waterproofing ability of the electronic device 1301 including the compensation member 1370 formed of the waterproof member may be improved.

The compensation member 1370 may be disposed on at least one of the conductive sheet 1380 or the conductive plate 1340. For example, when the conductive plate 1340 is disposed on the conductive sheet 1380, the compensation member 1370 may be disposed on the conductive plate 1340. According to an embodiment, when the conductive sheet 1380 is disposed on the conductive plate 1340, the compensation member 1370 may be disposed on the conductive sheet 1380.

Figure 14:
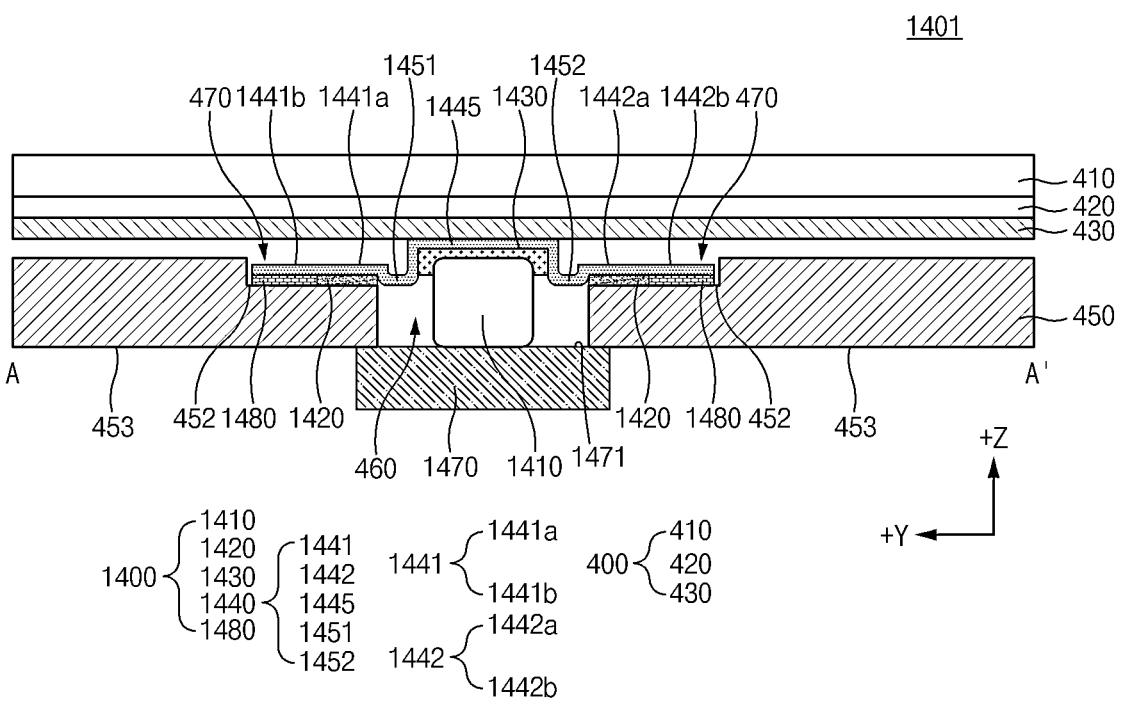
FIG. 14 is a sectional view illustrating a portion of an electronic device according to an embodiment.

FIG. 14 is a sectional view illustrating a portion of an electronic device according to an embodiment. The electronic device 1401 illustrated in FIG. 14 may be at least partially similar to the electronic device 101 illustrated in FIGS. 1 to 3, or may further include other embodiments.

Referring to FIG. 14, the electronic device 1401 according to an embodiment may include a display 400 (e.g., the display 106 of FIGS. 1 and 2), a mechanical support part 450 (e.g., the metal bracket 140 of FIG. 3), a support member 1470, and a conductive member 1400 (e.g., the conductive member 1000 of FIG. 10A). The electronic device 1401 may include other embodiments in which at least some of the components are omitted or other components are added. The configuration of the electronic device 1001 of FIG. 10A may be applied to the configuration of the electronic device 1401 of FIG. 14. Hereinafter, the electronic device 1401 of FIG. 11 will be described focusing on the configuration of the mechanical support part 450 and the support member 1470.

The mechanical support part 450 may include a first opening region 460 and a second opening region 470. The first opening region 460 may be formed in the shape of a hole that is open in a first direction (e.g., the +Z-axis direction) toward the display 400 and a direction opposite to the first direction. The second opening region 470 may be formed in the shape of a groove that is closed in the direction opposite to the first direction and open in the first direction.

The support member 1470 may be disposed adjacent to at least a portion of a rear surface 453 of the mechanical support part 450. A front surface 1471 of the support member 1470 may be disposed to make contact with at least a portion of the rear surface 453 of the mechanical support part 450.

The support member 1470 may be disposed to face a conductive plate 1440 with an elastic member 1410 therebetween. The support member 1470 may be a functional subsidiary member disposed on a printed circuit board disposed below the support member 1470. For example, the support member 1470 may include at least one of a mechanical part for a camera, a shield can, or an integrated circuit (IC). At least one processor, such as a communication modem, and at least one ground may be disposed on the printed circuit board.

The support member 1470 may support the elastic member 1410 accommodated in the first opening region 460. The support member 1470 may be formed to close the first opening region 460 that is open in the direction opposite to the first direction.

The conductive member 1400 may include the elastic member 1410 (e.g., the elastic member 1010 of FIG. 10A), a first adhesive member 1430 (e.g., the first adhesive member 1030 of FIG. 10A), a second adhesive member 1420 (e.g., the second adhesive member 1020 of FIG. 10A), the conductive plate 1440 (e.g., the conductive plate 1040 of FIG. 10A), and a conductive sheet 1480 (e.g., the conductive sheet 1080 of FIG. 10A).

The conductive plate 1440 may include a base region 1445 (e.g., the base region 1045 of FIG. 10A), one or more wing regions 1441 and 1442 (e.g., the wing regions 1041 and 1042 of FIG. 10A), and one or more buffer regions 1451 and 1452 (e.g., the buffer regions 1051 and 1052 of FIG. 10A).

Bonding regions 1441*a* and 1442*a* of the first and second wing regions 1441 and 1442 may be fused and bonded to the mechanical support part 450 together with the conductive sheet 1480. Adhesion regions 1441*b* and 1442*b* of the first and second wing regions 1441 and 1442 may be stuck to the mechanical support part 450 through the second adhesive member 1420.

Figure 15:
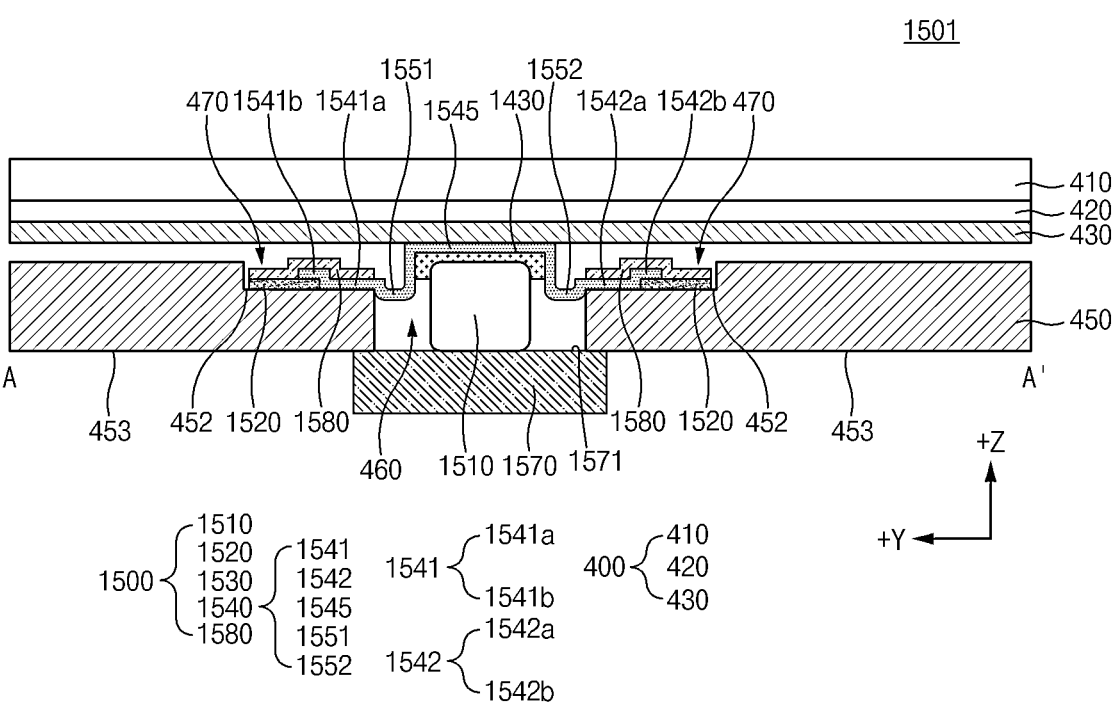
FIG. 15 is a sectional view illustrating a portion of an electronic device according to an embodiment.

FIG. 15 is a sectional view illustrating a portion of an electronic device according to an embodiment. The electronic device 1501 illustrated in FIG. 15 may be at least partially similar to the electronic device 101 illustrated in FIGS. 1 to 3, or may further include other embodiments.

Referring to FIG. 15, the electronic device 1501 according to an embodiment may include a display 400 (e.g., the display 106 of FIGS. 1 and 2), a mechanical support part 450 (e.g., the metal bracket 140 of FIG. 3), a support member 1570, and a conductive member 1500 (e.g., the conductive member 300 of FIGS. 4A and 4B). The electronic device 1501 may include other embodiments in which at least some of the components are omitted or other components are added. The configuration of the electronic device 1101 of FIG. 11 may be applied to the configuration of the electronic device 1501 of FIG. 15. Hereinafter, the electronic device 1501 of FIG. 15 will be described focusing on the configuration of the mechanical support part 450 and the support member 1570.

The mechanical support part 450 may include a first opening region 460 and a second opening region 470. The first opening region 460 may be formed in the shape of a hole that is open in a first direction (e.g., the +Z-axis direction) toward the display 400 and a direction opposite to the first direction. The second opening region 470 may be formed in the shape of a groove that is closed in the direction opposite to the first direction and open in the first direction.

The support member 1570 may be disposed adjacent to at least a portion of a rear surface 453 of the mechanical support part 450. A front surface 1571 of the support member 1570 may be disposed to make contact with at least a portion of the rear surface 453 of the mechanical support part 450.

The support member 1570 may be disposed to face a conductive plate 1540 with an elastic member 1510 therebetween. The support member 1570 may be a functional subsidiary member disposed on a printed circuit board disposed below the support member 1570. For example, the support member 1570 may include at least one of a mechanical part for a camera, a shield can, or an integrated circuit (IC). At least one processor, such as a communication modem, and at least one ground may be disposed on the printed circuit board.

The support member 1570 may support the elastic member 1510 accommodated in the first opening region 460. The support member 1570 may be formed to close the first opening region 460 that is open in the direction opposite to the first direction.

The conductive member 1500 may include the elastic member 1510 (e.g., the elastic member 1110 of FIG. 11), a first adhesive member 1530 (e.g., the first adhesive member 1130 of FIG. 11), a second adhesive member 1520 (e.g., the second adhesive member 1120 of FIG. 11), the conductive plate 1540 (e.g., the conductive plate 1140 of FIG. 11), and a conductive sheet 1580 (e.g., the conductive sheet 1180 of FIG. 11).

The conductive plate 1540 may include a base region 1545 (e.g., the base region 1145 of FIG. 11), one or more wing regions 1541 and 1542 (e.g., the wing regions 1141 and 1142 of FIG. 11), and one or more buffer regions 1551 and 1552 (e.g., the buffer regions 1151 and 1152 of FIG. 11).

Bonding regions 1541*a* and 1542*a* of the first and second wing regions 1541 and 1542 may be fused and bonded to the mechanical support part 450 together with the conductive sheet 1580. Adhesion regions 1541*b* and 1542*b* of the first and second wing regions 1541 and 1542 may be stuck to the mechanical support part 450 through the second adhesive member 1520.

Figure 16:
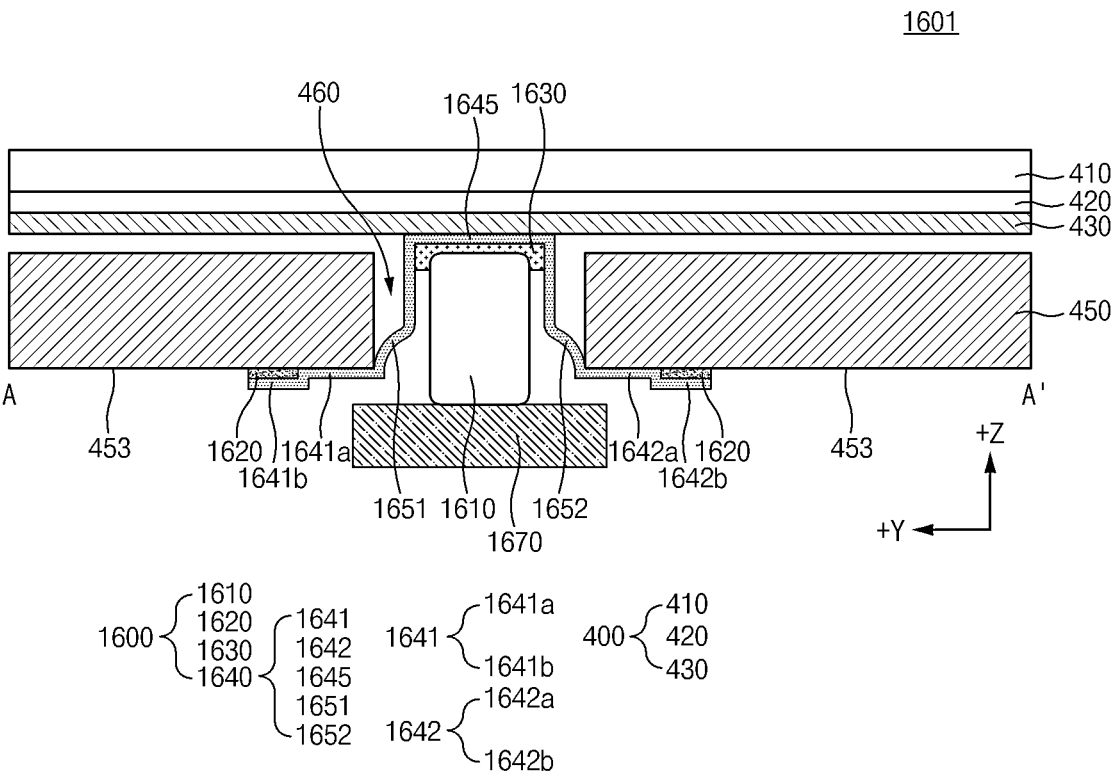
FIG. 16 is a sectional view illustrating a portion of an electronic device according to an embodiment.

FIG. 16 is a sectional view illustrating a portion of an electronic device according to an embodiment. The electronic device 1601 illustrated in FIG. 16 may be at least partially similar to the electronic device 101 illustrated in FIGS. 1 to 3, or may further include other embodiments.

Referring to FIG. 16, the electronic device 1601 according to an embodiment may include a display 400 (e.g., the display 106 of FIGS. 1 and 2), a mechanical support part 450 (e.g., the metal bracket 140 of FIG. 3), a support member 1670, and a conductive member 1600 (e.g., the conductive member 1400 of FIG. 14). The electronic device 1601 may include other embodiments in which at least some of the components are omitted or other components are added. The configuration of the electronic device 1401 of FIG. 14 may be applied to the configuration of the electronic device 1601 of FIG. 16. Hereinafter, the electronic device 1601 of FIG. 16 will be described focusing on the configuration of the mechanical support part 450 and the conductive member 1600.

The mechanical support part 450 may include at least one first opening region 460. The first opening region 460 may be formed in the shape of a hole that is open in a first direction (e.g., the +Z-axis direction) toward the display 400 and a direction opposite to the first direction.

The conductive member 1600 may include an elastic member 1610 (e.g., the elastic member 1410 of FIG. 14), a first adhesive member 1630 (e.g., the first adhesive member 1430 of FIG. 14), a second adhesive member 1620 (e.g., the second adhesive member 1420 of FIG. 14), and a conductive plate 1640 (e.g., the conductive plate 1440 of FIG. 14).

Figure 18:
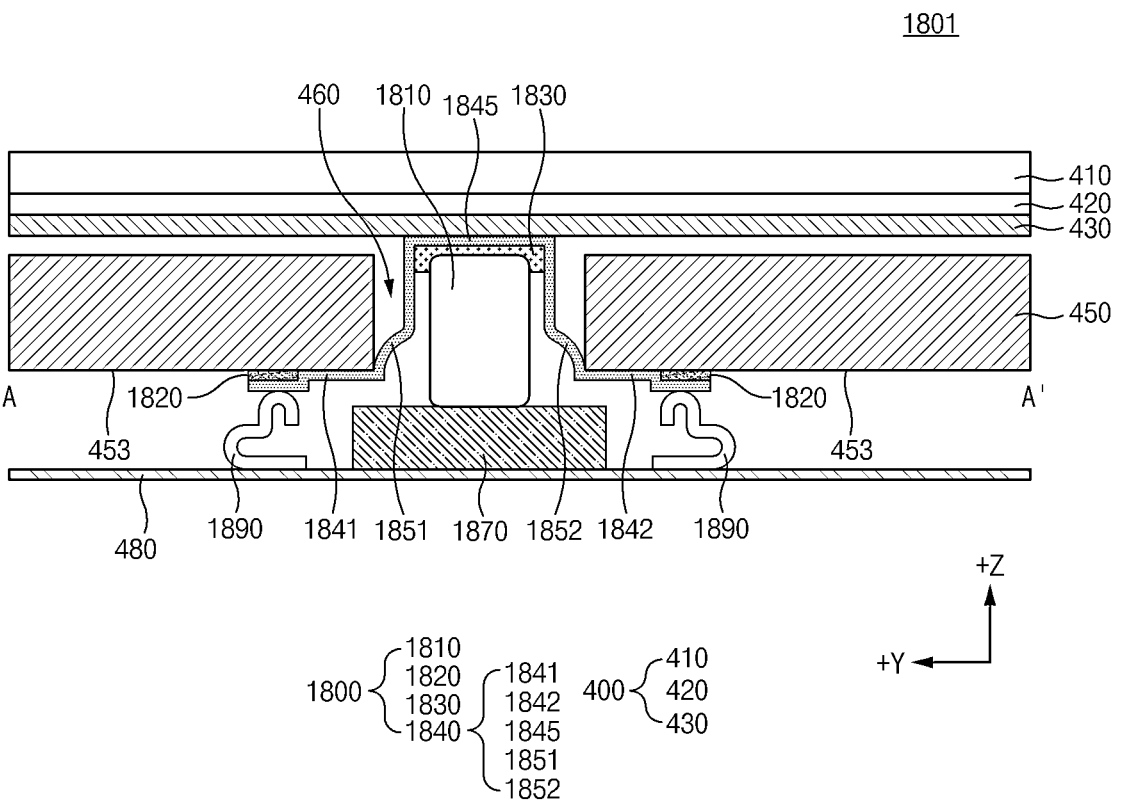
FIG. 18 is a sectional view illustrating a portion of an electronic device according to an embodiment.

The elastic member 1610 may be fixed to the support member 1670 disposed on a printed circuit board (e.g., a printed circuit board 480 of FIG. 18). The elastic member 1610 may be supported by the support member 1670. The support member 1670 may include at least one of a shield can, a mechanical structure, a camera structure, or an integrated circuit that faces toward the mechanical support part 450. The elastic member 1610 may have a thickness greater than the depth of the first opening region 460 having a hole shape.

The conductive plate 1640 may include a base region 1645 (e.g., the base region 1445 of FIG. 14), one or more wing regions 1641 and 1642 (e.g., the wing regions 1441 and 1442 of FIG. 14), and one or more buffer regions 1651 and 1652 (e.g., the buffer regions 1451 and 1452 of FIG. 14).

The one or more buffer regions 1651 and 1652 may extend from the base region 1645 to the wing regions 1641 and 1642 via the first opening region 460.

Adhesion regions 1641*b* and 1642*b* of the first and second wing regions 1641 and 162 may be stuck to the mechanical support part 450 through the second adhesive member 1620 attached to a rear surface 453 of the mechanical support part 450. Bonding regions 1641*a* and 1642*a* of the first and second wing regions 1641 and 1642 may be bonded to the mechanical support part 450 by being fused to the rear surface 453 of the mechanical support part 450.

Figure 17:
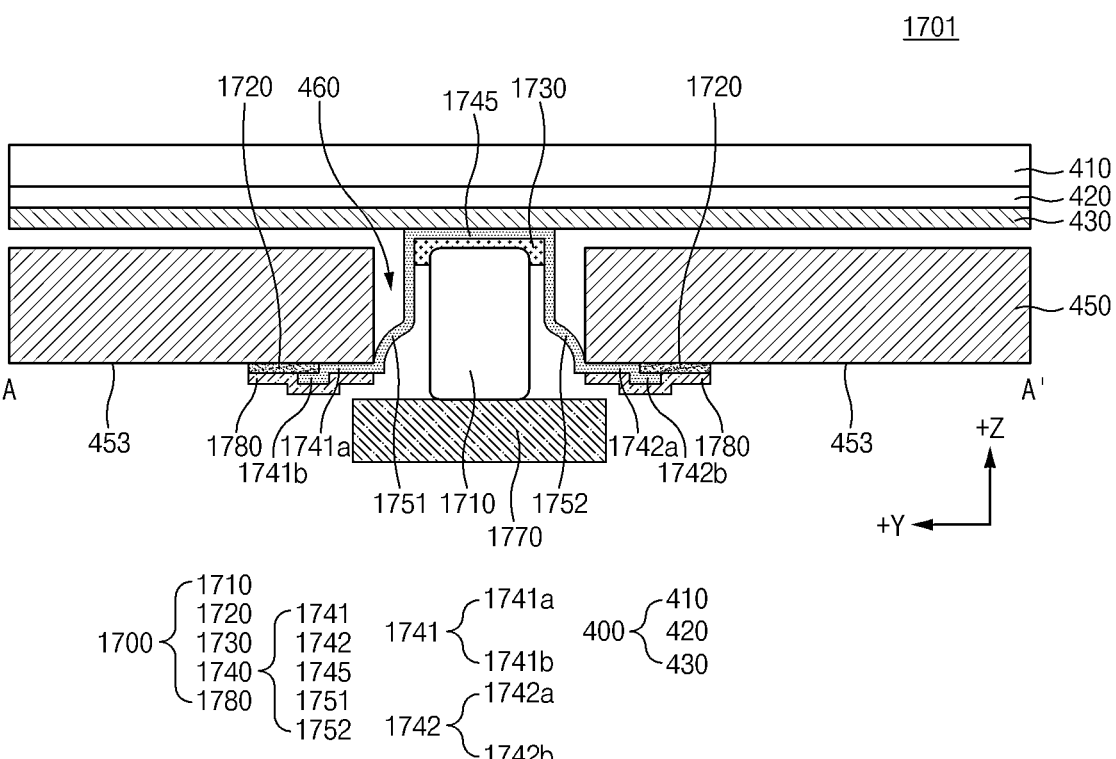
FIG. 17 is a sectional view illustrating a portion of an electronic device according to an embodiment.

FIG. 17 is a sectional view illustrating a portion of an electronic device according to an embodiment. The electronic device 1701 illustrated in FIG. 17 may be at least partially similar to the electronic device 101 illustrated in FIGS. 1 to 3, or may further include other embodiments.

Referring to FIG. 17, the electronic device 1701 according to an embodiment may include a display 400 (e.g., the display 106 of FIGS. 1 and 2), a mechanical support part 450 (e.g., the metal bracket 140 of FIG. 3), a support member 1770, and a conductive member 1700 (e.g., the conductive member 1500 of FIG. 15). The electronic device 1701 may include other embodiments in which at least some of the components are omitted or other components are added. The configuration of the electronic device 1501 of FIG. 15 may be applied to the configuration of the electronic device 1701 of FIG. 17. Hereinafter, the electronic device 1701 of FIG. 17 will be described focusing on the configuration of the mechanical support part 450 and the conductive member 1700.

The mechanical support part 450 may include at least one first opening region 460. The first opening region 460 may be formed in the shape of a hole that is open in a first direction (e.g., the +Z-axis direction) toward the display 400 and a direction opposite to the first direction.

The conductive member 1700 may include an elastic member 1710 (e.g., the elastic member 1510 of FIG. 15), a first adhesive member 1730 (e.g., the first adhesive member 1530 of FIG. 15), a second adhesive member 1720 (e.g., the second adhesive member 1520 of FIG. 15), a conductive plate 1740 (e.g., the conductive plate 1540 of FIG. 15), and a conductive sheet 1780 (e.g., the conductive sheet 1580 of FIG. 15).

The elastic member 1710 may be fixed to the support member 1770 disposed on a printed circuit board. The elastic member 1710 may be supported by the support member 1770. The support member 1770 may include at least one of a shield can, a mechanical structure, a camera structure, or an integrated circuit that faces toward the mechanical support part 450.

The conductive sheet 1780 may be formed on at least a portion of the remaining region other than a base region 1745 of the conductive plate 1740. The conductive sheet 1780 may be formed to cover the second adhesive member 1720, at least a partial region of a first wing region 1741, and at least a partial region of a second wing region 1742.

The conductive plate 1740 may include the base region 1745 (e.g., the base region 1545 of FIG. 15), one or more wing regions 1741 and 1742 (e.g., the wing regions 1541 and 1542 of FIG. 15), and one or more buffer regions 1751 and 1752 (e.g., the buffer regions 1551 and 1552 of FIG. 15).

The one or more buffer regions 1751 and 1752 may extend from the base region 1745 to the wing regions 1741 and 1742 via the first opening region 460.

Adhesion regions 1741*b* and 1742*b* of the first and second wing regions 1741 and 162 may be stuck to the mechanical support part 450 through the second adhesive member 1720 attached to a rear surface 453 of the mechanical support part 450. Bonding regions 1741*a* and 1742*a* of the first and second wing regions 1741 and 1742 may be bonded to the mechanical support part 450 by being fused to the rear surface 453 of the mechanical support part 450 together with the conductive sheet 1780.

FIG. 18 is a sectional view illustrating a portion of an electronic device according to an embodiment. The electronic device 1801 illustrated in FIG. 18 may be at least partially similar to the electronic device 101 illustrated in FIGS. 1 to 3, or may further include other embodiments.

Referring to FIG. 18, the electronic device 1801 according to an embodiment may include a display 400 (e.g., the display 106 of FIGS. 1 and 2), a mechanical support part 450 (e.g., the metal bracket 140 of FIG. 3), a support member 1870, the printed circuit board 480, a conductive member 1800 (e.g., the conductive member 1600 of FIG. 16), and a connecting member 1890. The electronic device 1801 may include other embodiments in which at least some of the components are omitted or other components are added. The configuration of the electronic device 1601 of FIG. 16 may be applied to the configuration of the electronic device 1801 of FIG. 18. Hereinafter, the electronic device 1801 of FIG. 18 will be described focusing on the configuration of the connecting member 1890.

The conductive member 1800 may include an elastic member 1610 (e.g., the elastic member 1610 of FIG. 16), a first adhesive member 1830 (e.g., the first adhesive member 1630 of FIG. 16), a second adhesive member 1820 (e.g., the second adhesive member 1620 of FIG. 16), and a conductive plate 1840 (e.g., the conductive plate 1640 of FIG. 16).

The elastic member 1810 may be supported on the support member 1870 disposed on the printed circuit board 480. The support member 1870 and at least one processor, such as a communication modem, may be disposed on the printed circuit board 480.

The conductive plate 1840 may include a base region 1845 (e.g., the base region 1645 of FIG. 16), one or more wing regions 1841 and 1842 (e.g., the wing regions 1641 and 1642 of FIG. 16), and one or more buffer regions 1851 and 1852 (e.g., the buffer regions 1651 and 1652 of FIG. 16).

The connecting member 1890 may be disposed between the printed circuit board 480 and each of the first wing region 1841 and the second wing region 1842. The connecting member 1890 may be, for example, a clip, a washer, a screw, a pogo-pin, a spring, or a conductive tape. The printed circuit board 480 may include a conductive pattern capable of implementing a ground that provides a reference potential of the electronic device 1801. Each of the first wing region 1841 and the second wing region 1842 may be electrically connected with the conductive pattern (e.g., the ground) of the printed circuit board 480 through the connecting member 1890. Accordingly, a panel conductive layer 430 of the display 400 may be electrically connected with the ground of the printed circuit board 480 through the conductive plate 1840 of the conductive member 1800 and the connecting member 1890. Thus, the generation of noise in the transmission of various signals within the electronic device 1801 may be suppressed, and damage to electrical/electronic components due to static electricity may be suppressed or prevented.

Figure 19:
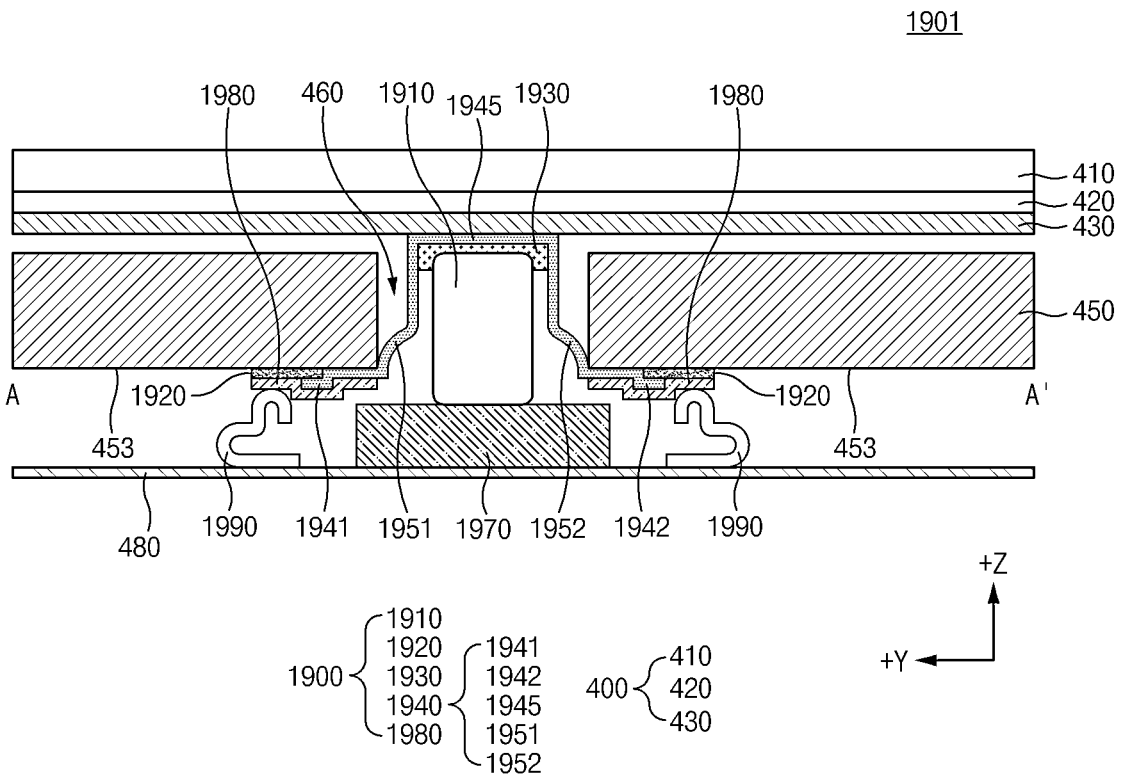
FIG. 19 is a sectional view illustrating a portion of an electronic device according to an embodiment.

FIG. 19 is a sectional view illustrating a portion of an electronic device according to an embodiment. The electronic device 1901 illustrated in FIG. 19 may be at least partially similar to the electronic device 101 illustrated in FIGS. 1 to 3, or may further include other embodiments.

Referring to FIG. 19, the electronic device 1901 according to an embodiment may include a display 400 (e.g., the display 106 of FIGS. 1 and 2), a mechanical support part 450 (e.g., the metal bracket 140 of FIG. 3), a support member 1970, a printed circuit board 480, a conductive member 1900 (e.g., the conductive member 1700 of FIG. 17), and a connecting member 1990. The electronic device 1901 may include other embodiments in which at least some of the components are omitted or other components are added. The configuration of the electronic device 1701 of FIG. 17 may be applied to the configuration of the electronic device 1901 of FIG. 19. Hereinafter, the electronic device 1901 of FIG. 19 will be described focusing on the configuration of the connecting member 1990.

The conductive member 1900 may include an elastic member 1910 (e.g., the elastic member 1710 of FIG. 17), a first adhesive member 1930 (e.g., the first adhesive member 1730 of FIG. 17), a second adhesive member 1920 (e.g., the second adhesive member 1720 of FIG. 17), a conductive plate 1940 (e.g., the conductive plate 1740 of FIG. 17), and a conductive sheet 1980 (e.g., the conductive sheet 1780 of FIG. 17).

The elastic member 1910 may be supported on the support member 1970 disposed on the printed circuit board 480. The support member 1970 and at least one processor, such as a communication modem, may be disposed on the printed circuit board 480.

The conductive plate 1940 may include a base region 1945 (e.g., the base region 1745 of FIG. 17), one or more wing regions 1941 and 1942 (e.g., the wing regions 1741 and 1742 of FIG. 17), and one or more buffer regions 1951 and 1952 (e.g., the buffer regions 1751 and 1752 of FIG. 17).

Partial regions of the first and second wing regions 1941 and 162 may be stuck to the mechanical support part 450 through the second adhesive member 1920 attached to a rear surface 453 of the mechanical support part 450. At least portions of the remaining regions of the first and second wing regions 1941 and 1942 may be bonded to the mechanical support part 450 by being fused to the rear surface 453 of the mechanical support part 450 together with the conductive sheet 1980. The conductive sheet 1980 may be formed to cover the second adhesive member 1920, at least a partial region of the first wing region 1941, and at least a partial region of the second wing region 1942.

The connecting member 1990 may be disposed between the conductive sheet 1980 and the printed circuit board 480. The connecting member 1990 may be, for example, a clip, a washer, a screw, a pogo-pin, a spring, or a conductive tape.

The printed circuit board 480 may include a conductive pattern capable of implementing a ground that provides a reference potential of the electronic device 1901. The conductive sheet 1980 may be electrically connected with the conductive pattern (e.g., the ground) of the printed circuit board 480 through the conductive member 1900. Accordingly, a panel conductive layer 430 of the display 400 may be electrically connected with the ground of the printed circuit board 480 through the conductive plate 1940, the conductive sheet 1980, and the connecting member 1990. Thus, the generation of noise in the transmission of various signals within the electronic device 1901 may be suppressed, and damage to electrical/electronic components due to static electricity may be suppressed or prevented.

Figure 20A:
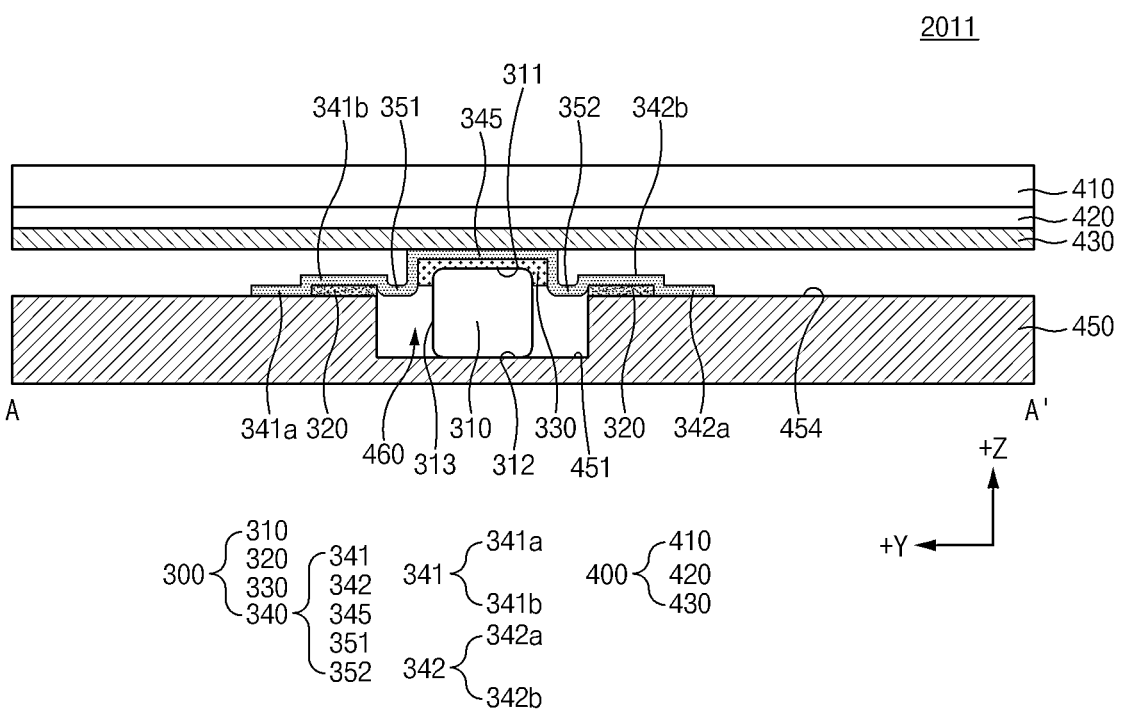
FIGS. 20A and 20B are sectional views illustrating portions of electronic devices according to an embodiment.
Figure 20B:
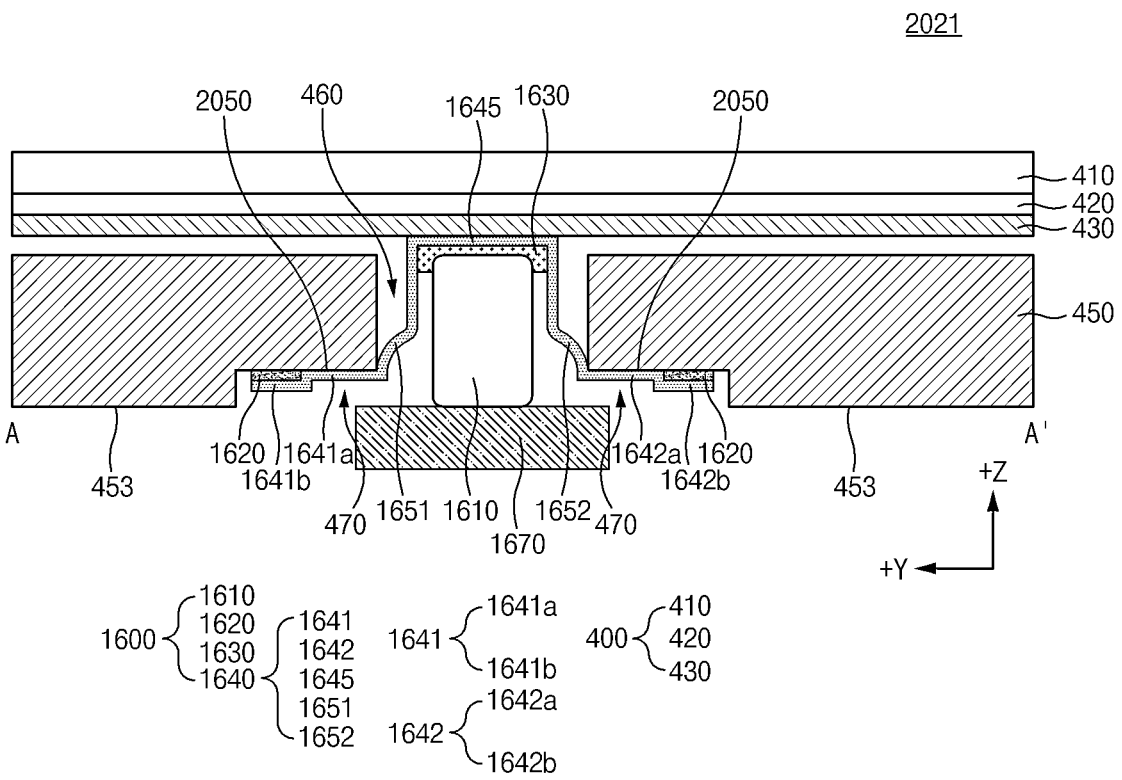

FIGS. 20A and 20B are sectional views illustrating portions of electronic devices according to an embodiment. The electronic device 2011 illustrated in FIG. 20A and the electronic device 2021 illustrated in FIG. 20B may not include at least one of the components included in the above-described embodiments, or may additionally include other components.

According to an embodiment, the electronic device 2011 illustrated in FIG. 20A may not include at least one component (e.g., the second opening region) among the components of one of the electronic devices illustrated in FIGS. 4A, 4B, 10A, 10B, 11, 12, 13, 14, and 15. Hereinafter, an embodiment in which the second opening region 470 among the components of the electronic device 401 of FIG. 4A is omitted will be described, and repetitive descriptions of components identical or similar to the components of the electronic device 401 of FIG. 4A will be omitted.

A mechanical support part 450 illustrated in FIG. 20A may include a first opening region 460. The first opening region 460 may be formed in the shape of a groove that is open in a first direction (e.g., the +Z-axis direction) toward a display 400. At least a portion of an elastic member 310 may be accommodated in the first opening region 460. A front surface 311 of the elastic member 310 may further protrude beyond a front surface 454 (e.g., a surface facing in the +Z-axis direction) of the mechanical support part 450.

At least a portion of a conductive plate 340 may be disposed between the front surface 454 of the mechanical support part 450 and the display 400. A first wing region 341 and a second wing region 342 of the conductive plate 340 may be disposed on the front surface 454 of the mechanical support part 450. Adhesion regions 341b and 342b of the first and second wing regions 341 and 342 may be stuck to the mechanical support part 450 through a second adhesive member 320 attached to the front surface 454 of the mechanical support part 450. Bonding regions 341a and 342a of the first and second wing regions 341 and 342 may be bonded to the mechanical support part 450 by being fused to the front surface 454 of the mechanical support part 454.

According to an embodiment, the electronic device 2021 illustrated in FIG. 20B may additionally include another component (e.g., a second opening region) in addition to the components of one of the electronic devices illustrated in FIGS. 16, 17, 18, and 19. Hereinafter, an embodiment in which a second opening region 470 is additionally included in the electronic device 1601 of FIG. 16 will be described, and repetitive descriptions of components identical or similar to the components of the electronic device 1601 of FIG. 16 will be omitted.

A mechanical support part 450 illustrated in FIG. 20B may include a first opening region 460 and at least one second opening region 470. The second opening region 470 may be formed in the shape of a groove that is open toward a support member 1670. The second opening region 470 may be formed in the shape of a groove that is open in a direction opposite to a first direction (e.g., the +Z-axis direction). The second opening region 470 may be connected with the first opening region 460. The first opening region 460 in which an elastic member 310 is accommodated may have a greater depth than the depth of the second opening region 470. A portion of a conductive plate 1640 of a conductive member 1600 may be accommodated in the second opening region 470. The width and depth of the second opening region 470 may be formed in consideration of the thickness and length of the conductive plate 1640.

Wing regions 1641 and 1642 of the conductive plate 1640 may be accommodated in the second opening region 470. The first wing region 1641 and the second wing region 1642 may be disposed on an inner surface 2050 (e.g., a surface facing in the direction opposite to the +Z-axis direction) of the mechanical support part 450 formed by the second opening region 470. Adhesion regions 1641b and 1642b of the first and second wing regions 1641 and 1642 may be stuck to the mechanical support part 450 through a second adhesive member 1620 attached to the inner surface 2050 of the mechanical support part 450. Bonding regions 1641a and 1642a of the first and second wing regions 1641 and 1642 may be fused to the mechanical support part 450 by being fused to the inner surface 2050 the mechanical support part 450.

Figure 21:
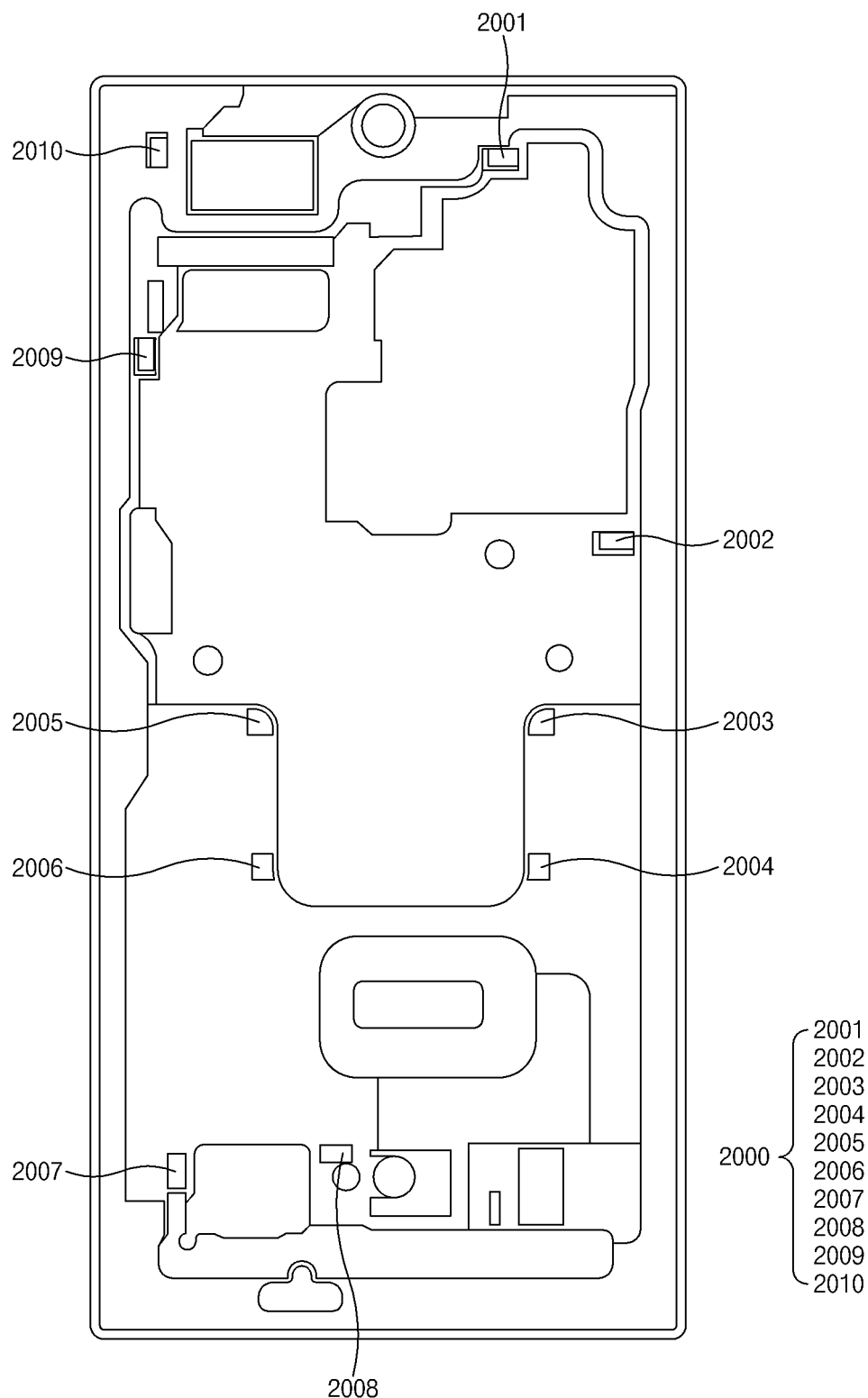
FIG. 21 is a plan view for explaining an arrangement of conductive members in an electronic device according to an embodiment.

FIG. 21 is a plan view for explaining an arrangement of conductive members in an electronic device according to an embodiment.

Referring to FIG. 21, a plurality of conductive members 2000 may be formed in the electronic device. The plurality of conductive members 2000 may be accommodated in a support structure. The positions and number of conductive members 2000 may vary depending on mechanical parts located around the conductive members 2000.

Among the plurality of conductive members 2000, some conductive members 2009 and 2010 may be formed along a conductive part (e.g., the conductive part 202 of FIG. 1) that is included in a side bezel structure (e.g., the side bezel structure 118 of FIG. 1) and that serves as an antenna. Among the plurality of conductive members 2000, the other conductive members 2001, 2002, 2003, 2004, 2005, 2006, 2007, and 2008 may be formed around a camera module and a battery module.

Figure 22A:
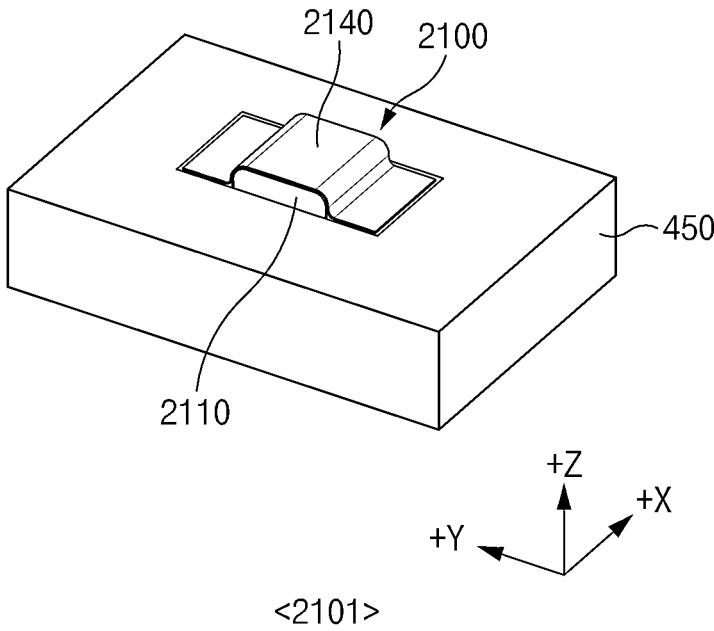
FIGS. 22A to 22C are views for explaining a method of manufacturing an electronic device according to an embodiment.
Figure 22A:
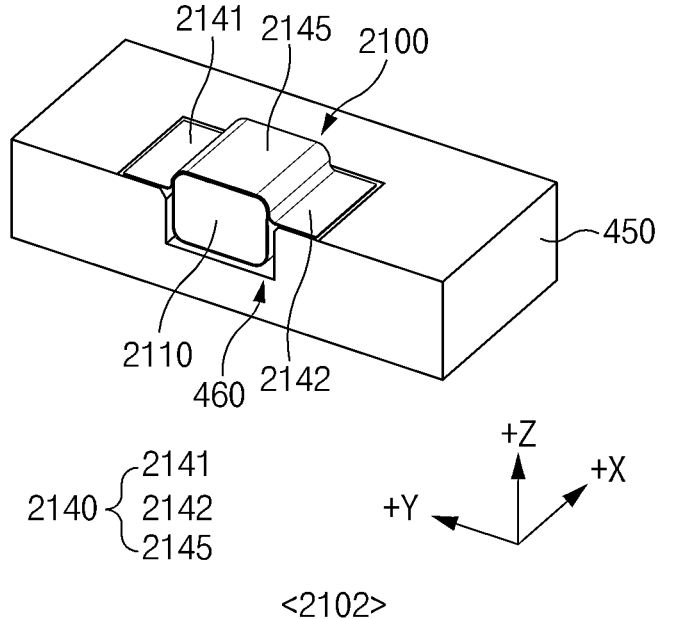
Figure 22B:
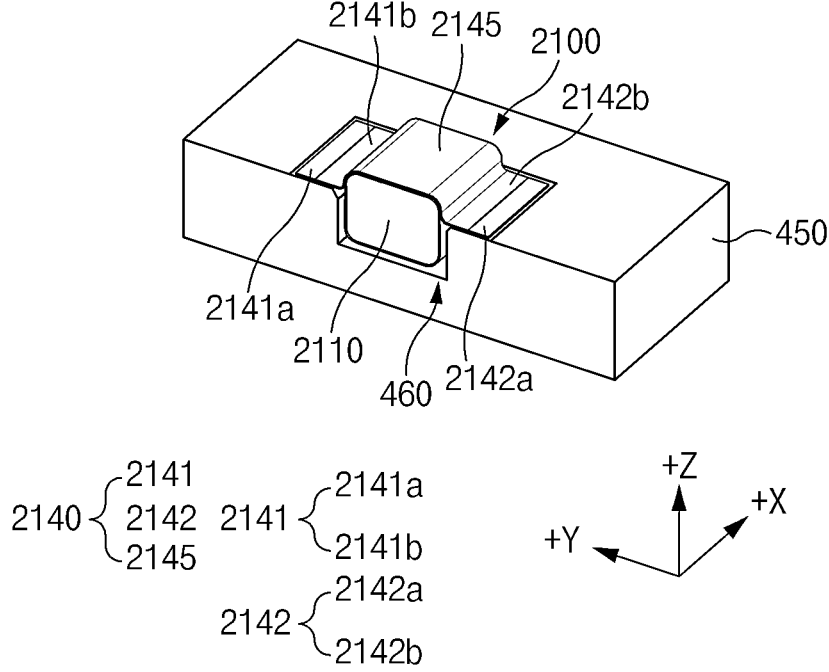
Figure 22C:
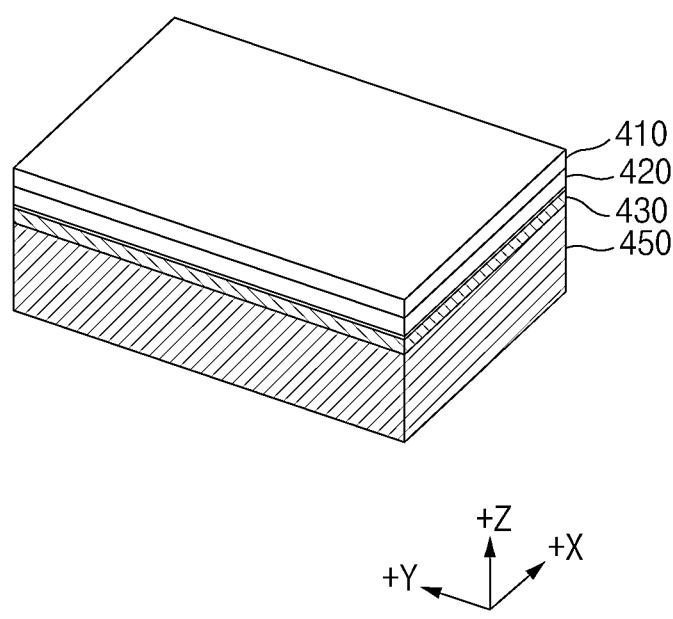

FIGS. 22A to 22C are views for explaining a method of manufacturing an electronic device according to an embodiment. In FIG. 22A, "2101" is a perspective view for explaining the method of manufacturing the electronic device according to an embodiment, and "2102" is a view illustrating a section of a portion of the electronic device according to an embodiment.

Referring to FIG. 22A, a first adhesive member (e.g., the first adhesive member 330 of FIGS. 4A and 4B) may be applied to an elastic member 2110. The first adhesive member may be melted when heated to a high temperature and may be applied to the elastic member 2110. For example, the first adhesive member may be a hotmelt adhesive. The elastic member 2110, to which the first adhesive member is applied, may be accommodated in a first opening region 460 of a mechanical support part 450.

According to an embodiment, a third adhesive member (e.g., the third adhesive member 922 of FIG. 9), which is able to be used at room temperature, may be attached to a rear surface of the elastic member 2110 that faces a first inner surface of the mechanical support part 450. The elastic member 2110 may be temporarily bonded in the first opening region 460 of the mechanical support part 450 through the third adhesive member.

A conductive plate 2140 may be disposed on a front surface of the elastic member 2110 and the mechanical support part 450. The conductive plate 2140 may be temporarily bonded to the mechanical support part 450 through a second adhesive member. The conductive plate 2140 may include a base region 2145, a first wing region 2141, and a second wing region 2142. One portion of at least one of the first wing region 2141 and the second wing region 2142 may overlap the second adhesive member, and the remaining portion of the at least one of the first wing region 2141 and the second wing region 2142 may not overlap the second adhesive member.

Referring to FIG. 22B, the conductive plate 2140 may be coupled with the mechanical support part 450 by fusing bonding regions 2141a and 2142a of the first and second wing regions 2141 and 2142, which do not overlap the second adhesive member, with a laser or ultrasonic waves. The bonding regions 2141a and 2142a of the first and second wing regions 2141 and 2142, which do not overlap the second adhesive member, may be electrically coupled with the mechanical support part 450. Contact regions 2141b and 2142b of the first and second wing regions 2141 and 2142, which overlap the second adhesive member, may be electrically coupled with the mechanical support part 450.

Referring to FIG. 22C, a display (e.g., the display 400 of FIGS. 4A and 4B) including a window layer 410, a display panel layer 420, and at least one panel conductive layer 430 may be seated on the mechanical support part 450 fused with the conductive plate 2140.

Figure 23:
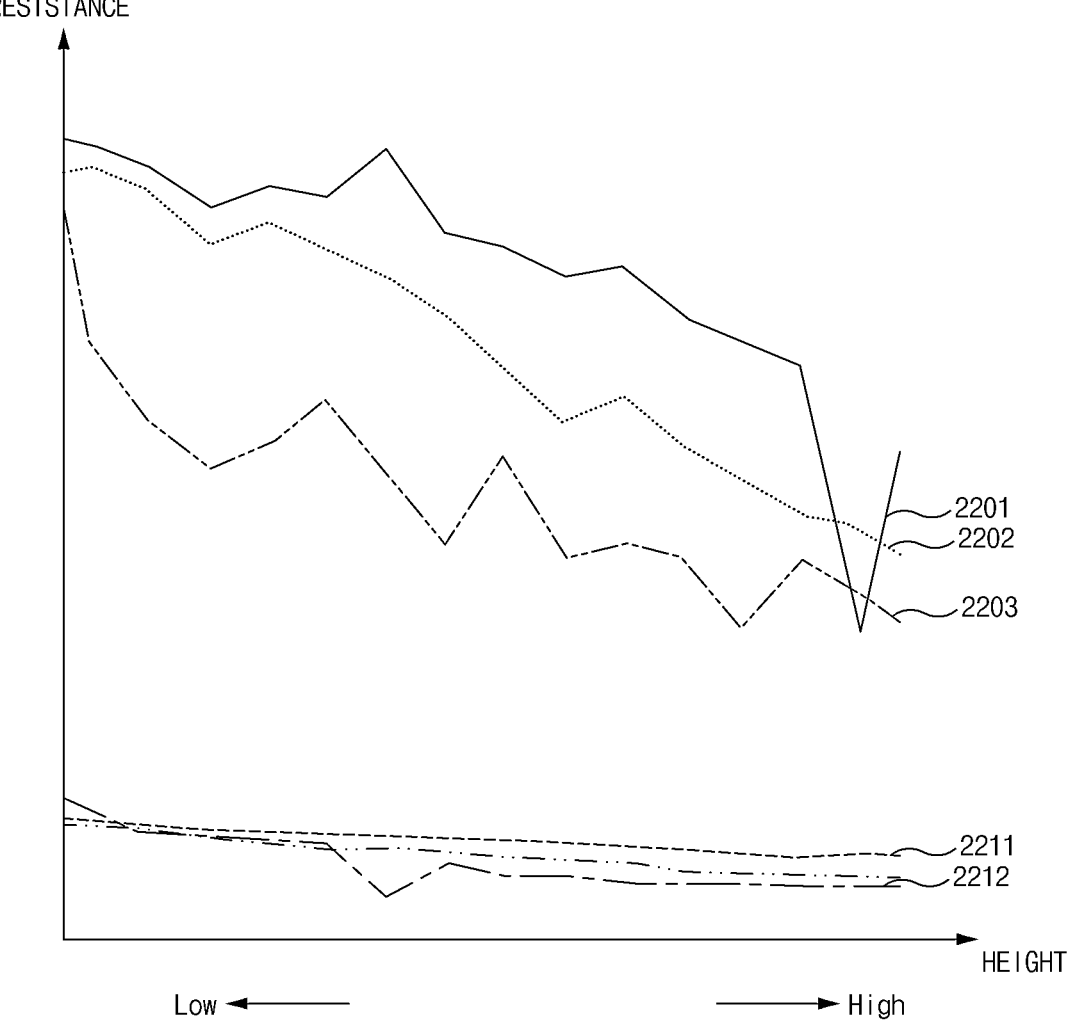
FIG. 23 is a view illustrating measurement results of vertical resistance depending on heights of electronic devices according to an embodiment.

FIG. 23 is a view illustrating measurement results of vertical resistance depending on the heights of electronic devices according to an embodiment. In FIG. 23, "2201", "2202", and "2203" are graphs depicting vertical resistance levels in comparative examples in which conductive members not including wing regions are provided. "2211" and "2212" are graphs depicting vertical resistance levels in embodiments in which conductive members including wing regions are provided.

Referring to FIG. 23, in the comparative examples 2201, 2202, and 2203 and the embodiments 2211 and 2212, when external forces applied to the electronic devices are increased, elastic members of the conductive members may be compressed, and thus the heights (thicknesses) of the electronic devices may be decreased. It can be seen that in the embodiments 2211 and 2212, the vertical resistances between panel conductive layers of displays and the conductive members may be lower at the same height than in the comparative examples 2201, 2202, and 2203 and the deviations in the embodiments 2211 and 2212 are smaller than the deviations in the comparative examples 2201, 2202, and 2203. Accordingly, in the embodiments in which the vertical resistance components are lower than those in the comparative examples, a decrease in the receiving sensitivity of RF signals affected by the vertical resistance components (e.g., desense) may be reduced.

The conductive members of the electronic devices described above are not limited to the embodiments described with reference to the drawings, and the conductive members described above with reference to the drawings may be applied in combination. For example, in an electronic device according to an embodiment, only the conductive member described with reference to each drawing may be employed in plural numbers, or a combination of one or more of the conductive members described with reference to FIGS. 4A to 20B may be employed. Alternatively, in an electronic device according to an embodiment, only the conductive member described with reference to each drawing may be employed in plural numbers in the mechanical support part described with reference to each drawing, or a combination of one or more of the conductive members described with reference to FIGS. 4A to 20B may be employed in one of the mechanical support parts described with reference to FIGS. 4A, 4B, 10A, 10B, 11 to 19, 20A, and 20B.

A conductive member according to an embodiment of the disclosure may include an elastic member 310 and a conductive plate 340 including a base region 345 that surrounds at least a portion of the elastic member and a wing region 341 and 342. The elastic member 310 may include a front surface 311 that faces in a first direction and that is disposed in a higher position than the wing region 341 and 342, a side surface that is parallel to the first direction and faces in a second direction perpendicular to the first direction, and a rear surface 312 that faces in a direction opposite to the first direction and that is disposed in a lower position than the wing region 341 and 342. The wing region may extend in the second direction.

According to an embodiment, the conductive plate may further include a buffer region that is disposed between the base region and the wing region and that has a bent shape.

According to an embodiment, the conductive member may further include a first adhesive member disposed between the base region and the elastic member and a second adhesive member attached to a partial area of the wing region and formed of a material different from a material of the first adhesive member. The wing region may include an adhesion region that overlaps the second adhesive member and a bonding region that does not overlap the second adhesive member.

The conductive member may further include a conductive sheet that is formed on at least one of an upper portion or a lower portion of the wing region and that at least partially overlaps a bonding region of the wing region.

According to an embodiment, the base region may include at least one protrusion that protrudes in the first direction.

An electronic device according an embodiment of the disclosure may include a display 400 including a panel conductive layer 430, a mechanical support part 450 that faces the display, and a conductive member 300 disposed between the panel conductive layer and the mechanical support part. The conductive member 300 may include an elastic member 310 at least partially accommodated in the mechanical support part 450 and a conductive plate 340 electrically connected with the panel conductive layer 430, the conductive plate 340 including a base region 345 that surrounds at least a portion of the elastic member 310 and a wing region 341 and 342. The elastic member 310 may include a front surface 311 that faces in a first direction toward the panel conductive layer 430 and that is disposed in a higher position than the wing region, a side surface that is parallel to the first direction and faces in a second direction perpendicular to the first direction, and a rear surface 312 that faces in a second direction opposite to the first direction and that is disposed in a lower position than the wing region. The wing region may extend in the second direction.

According to an embodiment, the conductive plate may further include a buffer region that is disposed between the base region and the wing region and that has a bent shape, and the base region of the conductive plate may surround the front surface of the elastic member.

According to an embodiment, the electronic device may further include a first adhesive member disposed between the base region and the elastic member and a second adhesive member attached to a partial area of the wing region and formed of a material different from a material of the first adhesive member. The wing region may include an adhesion region that overlaps the second adhesive member and a bonding region fused to the mechanical support part.

According to an embodiment, the electronic device may further include a conductive sheet that is formed on at least one of an upper portion or a lower portion of the wing region and that at least partially overlaps a bonding region of the wing region.

According to an embodiment, the base region may include at least one protrusion that protrudes in the first direction.

According to an embodiment, the electronic device may further include a conductive sheet that is formed on at least one of an upper portion or a lower portion of the wing region and that at least partially overlaps a bonding region of the wing region.

According to an embodiment, the electronic device may further include at least one third adhesive member disposed between the conductive sheet and the mechanical support part. The conductive sheet may include a first conductive region that overlaps the third adhesive member and a second conductive region that extends from the first conductive region to a region between a plurality of second adhesive members.

According to an embodiment, the mechanical support part may include a first opening region that has a groove shape open toward the display and in which the elastic member is accommodated and a second opening region that has a groove shape open toward the display and in which the wing region is accommodated.

According to an embodiment, the first opening region may have a greater depth than the second opening region.

According to an embodiment, the electronic device may further include a support member that faces the conductive plate, and the elastic member is disposed between the support member and the conductive plate.

According to an embodiment, the support member may include at least one of a shield can, an integrated circuit, or a camera structure.

According to an embodiment, the mechanical support part may include a first opening region that has a hole shape closed by the support member, the elastic member being accommodated in the first opening, and a second opening region that has a groove shape open toward the display, the wing region being accommodated in the second opening.

According to an embodiment, the mechanical support part may include an opening region that has a hole shape closed by the support member, the elastic member being accommodated in the opening region, and the wing region may be fixed to a rear surface of the mechanical support part that faces in the second direction.

According to an embodiment, the support member may be disposed on a printed circuit board, and the wing region may be electrically connected with a conductive pattern of the printed circuit board through a connecting member.

According to an embodiment, the connecting member may include at least one of a clip, a screw, or a washer.

In the electronic device according to the embodiments of the disclosure, a conductive member, which includes an elastic member and a conductive plate including wing regions, may be stably electrically connected with a panel conductive layer of a display.

In the electronic device according to the embodiments of the disclosure, the vertical resistance of the conductive member may be stably kept low, and thus a decrease in the receiving sensitivity of an RF signal affected by the vertical resistance may be reduced.

In the electronic device according to the embodiments of the disclosure, the conductive member may be made compact. Accordingly, an opening region of a mechanical support part in which the conductive member is accommodated may be decreased, and thus the rigidity of the mechanical support part may be increased.

In addition, the disclosure may provide various effects that are directly or indirectly recognized.

The various embodiments of the disclosure and the terms used herein do not limit the technology described in the disclosure to specific forms, and should be construed to include various modifications, equivalents, and/or replacements of the embodiments. With regard to description of drawings, similar components may be marked by similar reference numerals. In the disclosure disclosed herein, the expressions "A or B", or "at least one of A or/and B", "A, B, or C", or "at least one of A, B, or/and C", and the like used herein may include any and all combinations of one or more of the associated listed items. The terms, such as "first", "second", and the like used herein may refer to various elements of various embodiments of the disclosure, but do not limit the elements. For example, such terms are used only to distinguish an element from another element and do not limit the order and/or priority of the elements. If it is mentioned that an element (e.g., a first element) is (functionally or communicatively) "connected" to another element (e.g., a second element), the first element may be directly connected to the second element or may be connected to the second element through another element (e.g., a third element).

In the disclosure, the expression "configured to" may be interchangeably used with, for example, "suitable for", "capable of", "modified to", "made to", "able to", or "designed to" according to a situation in a hardware or software way. In some situations, the expression "a device configured to" may refer, for example to the device being "capable of" operating together with another device or other components. CPU, for example, a "processor configured to (or set to) perform A, B, and C" may refer, for example, to a dedicated processor (e.g., an embedded processor) for performing a corresponding operation or a generic-purpose processor (e.g., a central processing unit (CPU) or an application processor) which may perform corresponding operations by executing one or more programs which are stored in a memory device.

The term "module" used in the disclosure may include a unit configured in a hardware, software, or firmware way, or any combination thereof, and for example, may be used interchangeably with the terms such as logic, a logic block, a component, or a circuit. The "module" may be an integral component, or a minimum unit or a part which performs one or more functions. The "module" may be implemented mechanically or electronically, and for example, may include an application-specific integrated circuit (ASIC) chip, field-programmable gate arrays (FPGAs), or a programmable logic device that is known or to be developed in the future, which performs some operations.

At least some of the devices (e.g., modules or functions) or methods (e.g., operations) according to various embodiments of the disclosure may be implemented by an instruction stored in a computer-readable storage medium (e.g., the memory), for example, in the form of a program module. When the instruction is executed by the processor (for example, the processor), the at least one processor may perform a function corresponding to the instruction. The computer-readable recording medium may include a hard disk, a floppy disk, a magnetic medium (e.g., a magnetic tape), an optical recording medium (e.g., a compact disc read only memory (CD-ROM) or a digital versatile disc (DVD)), a magneto-optical medium (e.g., a floptical disk), and an embedded memory. The instruction may include a code made by a compiler or a code that may be executed by an interpreter.

According to various embodiments, each component (e.g., a module or a program) of the above-described components may include a single entity or multiple entities and some of multiple entities may be separately disposed on the other components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. A conductive member comprising:
an elastic member; and
a conductive plate including a base region configured to surround at least a portion of the elastic member and a wing region,
wherein the elastic member includes:
a front surface configured to face in a first direction and disposed in a higher position than the wing region;
a side surface configured to be parallel to the first direction and to face in a second direction perpendicular to the first direction; and
a rear surface configured to face in a direction opposite to the first direction and disposed in a lower position than the wing region, and
wherein the wing region is configured to extend in the second direction.

2. The conductive member of claim 1, wherein the conductive plate further includes a buffer region disposed between the base region and the wing region, the buffer region having a bent shape.

3. The conductive member of claim 1, further comprising:
a first adhesive member disposed between the base region and the elastic member; and
a second adhesive member attached to a partial area of the wing region and formed of a material different from a material of the first adhesive member,
wherein the wing region includes:
an adhesion region configured to overlap the second adhesive member; and
a bonding region configured not to overlap the second adhesive member.

4. The conductive member of claim 1, further comprising:
a conductive sheet formed on at least one of an upper portion or a lower portion of the wing region and configured to at least partially overlap a bonding region of the wing region.

5. The conductive member of claim 1, wherein the base region includes at least one protrusion configured to protrude in the first direction.

6. An electronic device comprising:
a display including a panel conductive layer;
a mechanical support part configured to face the display; and
a conductive member disposed between the panel conductive layer and the mechanical support part,
wherein the conductive member includes:
an elastic member at least partially accommodated in the mechanical support part; and
a conductive plate electrically connected with the panel conductive layer, the conductive plate including a base region configured to surround at least a portion of the elastic member and a wing region, and
wherein the elastic member includes:
a front surface configured to face in a first direction toward the panel conductive layer and disposed in a higher position than the wing region;
a side surface configured to be parallel to the first direction and to face in a second direction perpendicular to the first direction; and
a rear surface configured to face in a direction opposite to the first direction and disposed in a lower position than the wing region, and
wherein the wing region is configured to extend in the second direction.

7. The electronic device of claim 6, wherein the conductive plate further includes a buffer region disposed between the base region and the wing region, the buffer region having a bent shape, and
wherein the base region of the conductive plate surrounds the front surface of the elastic member.

8. The electronic device of claim 6, further comprising:
a first adhesive member disposed between the base region and the elastic member; and
a second adhesive member attached to a partial area of the wing region and formed of a material different from a material of the first adhesive member,
wherein the wing region includes:
an adhesion region configured to overlap the second adhesive member; and
a bonding region fused to the mechanical support part.

9. The electronic device of claim 6, further comprising:
a conductive sheet formed on at least one of an upper portion or a lower portion of the wing region and configured to at least partially overlap a bonding region of the wing region.

10. The electronic device of claim 6, wherein the base region includes at least one protrusion configured to protrude in the first direction.

11. The electronic device of claim 9, further comprising:
at least one third adhesive member disposed between the conductive sheet and the mechanical support part.

12. The electronic device of claim 11, wherein the second adhesive member includes a plurality of second adhesive members, and
wherein the conductive sheet includes:
a first conductive region configured to overlap the third adhesive member; and
a second conductive region configured to extend from the first conductive region to a region between the plurality of second adhesive members.

13. The electronic device of claim 6, wherein the mechanical support part includes:
a first opening region having a groove shape open toward the display, wherein the elastic member is accommodated in the first opening region; and
a second opening region having a groove shape open toward the display, wherein the wing region is accommodated in the second opening region.

14. The electronic device of claim 13, wherein the first opening region has a greater depth than the second opening region.

15. The electronic device of claim 6, further comprising:
a support member configured to face the conductive plate, the elastic member being disposed between the support member and the conductive plate.

16. The electronic device of claim 15, wherein the support member includes at least one of a shield can, an integrated circuit, or a camera structure.

17. The electronic device of claim 15, wherein the mechanical support part includes:
a first opening region having a hole shape closed by the support member, wherein the elastic member is accommodated in the first opening region; and
a second opening region having a groove shape open toward the display, wherein the wing region is accommodated in the second opening region.

18. The electronic device of claim 15, wherein the mechanical support part includes an opening region having a hole shape closed by the support member, wherein the elastic member is accommodated in the hole region, and
wherein the wing region is fixed to a rear surface of the mechanical support part configured to face in the second direction.

19. The electronic device of claim 15, wherein the support member is disposed on a printed circuit board, and
wherein the wing region is electrically connected with a conductive pattern of the printed circuit board through a connecting member.

20. The electronic device of claim 19, wherein the connecting member includes at least one of a clip, a screw, or a washer.

* * * * *